United States Patent
Hasei

(10) Patent No.: US 7,146,910 B2
(45) Date of Patent: Dec. 12, 2006

(54) METHOD FOR FABRICATING PATTERN, APPARATUS FOR FABRICATING PATTERN, CONDUCTIVE FILM WIRING, METHOD FOR FABRICATING DEVICE, ELECTRO-OPTICAL APPARATUS, AND ELECTRONIC APPARATUS

(75) Inventor: Hironori Hasei, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/953,519

(22) Filed: Sep. 30, 2004

(65) Prior Publication Data

US 2005/0034622 A1   Feb. 17, 2005

Related U.S. Application Data

(62) Division of application No. 10/409,210, filed on Apr. 9, 2003, now Pat. No. 6,810,814.

(30) Foreign Application Priority Data

Apr. 16, 2002 (JP) ............................. 2002-113753
Mar. 28, 2003 (JP) ............................. 2003-091044

(51) Int. Cl.
*B41F 1/34* (2006.01)

(52) U.S. Cl. ........................ 101/485; 347/41; 347/55; 347/74

(58) Field of Classification Search ............... 101/483, 101/485, 486; 400/120.09; 347/41, 55, 347/74, 81, 82; 427/8, 78, 79, 96, 98, 145
See application file for complete search history.

(56) References Cited

U.S. PATENT DOCUMENTS

| | | | |
|---|---|---|---|
| 3,949,121 A | 4/1976 | Kenney | |
| 4,432,003 A | 2/1984 | Barbero et al. | |
| 5,807,437 A | 9/1998 | Sachs et al. | |
| 5,876,615 A | 3/1999 | Predetechensky | |
| 6,017,259 A * | 1/2000 | Motoi et al. | ............. 445/51 |
| 6,060,113 A | 5/2000 | Banno et al. | |
| 6,164,850 A | 12/2000 | Speakman | |
| 6,210,245 B1 | 4/2001 | Sando et al. | |
| 6,309,691 B1 | 10/2001 | Hasegawa | |
| 6,501,663 B1 | 12/2002 | Pan | |
| 6,503,831 B1 | 1/2003 | Speakman | |
| 6,673,388 B1 | 1/2004 | Blanton et al. | |

FOREIGN PATENT DOCUMENTS

| | | |
|---|---|---|
| JP | A 10-283917 | 10/1988 |
| JP | A 10-69850 | 3/1998 |
| JP | A-11-207959 | 8/1999 |
| JP | A 11-274671 | 10/1999 |
| JP | A 2000-216330 | 8/2000 |
| JP | 2002-049031 | 2/2002 |
| JP | A-2003-133691 | 5/2003 |
| JP | A-2003-317553 | 11/2003 |
| JP | A-2003-324266 | 11/2003 |

\* cited by examiner

*Primary Examiner*—Ren Yan
(74) *Attorney, Agent, or Firm*—Oliff & Berridge, PLC

(57) ABSTRACT

A method and an apparatus for fabricating a pattern which makes it possible to obtain a wide pattern having edges of a preferable shape. The apparatus for fabricating a pattern ejects a liquid material as liquid droplets from an ejecting section, and dispose the liquid droplets on a substrate in a line-shaped pattern. A plurality of line-shaped patterns are formed on the substrate by disposing a plurality of liquid droplets on the substrate in the line-shaped patterns, and then another set of liquid droplets are disposed between the line-shaped patterns so as to integrate the line-shaped patterns with each other.

6 Claims, 15 Drawing Sheets

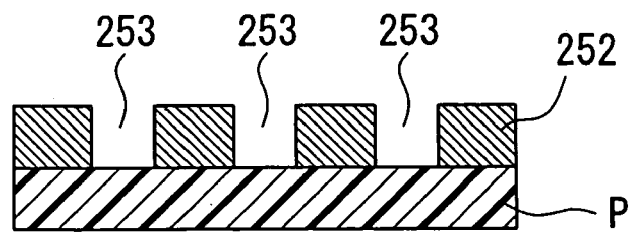
FIG. 14A
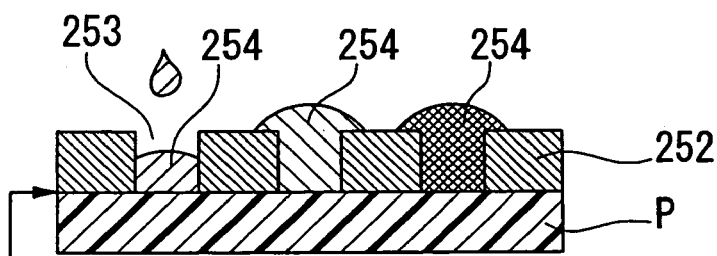
FIG. 14B
FIG. 14C
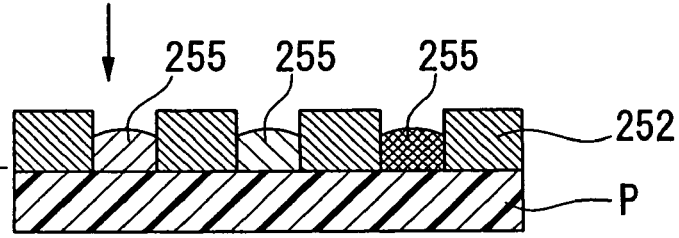
FIG. 14D
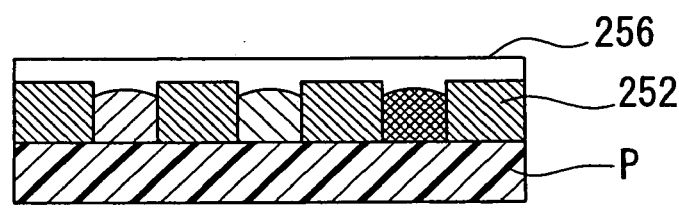
FIG. 14E
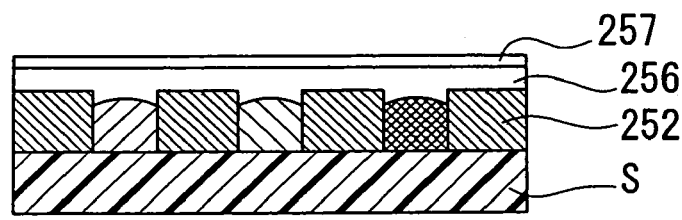
FIG. 14F
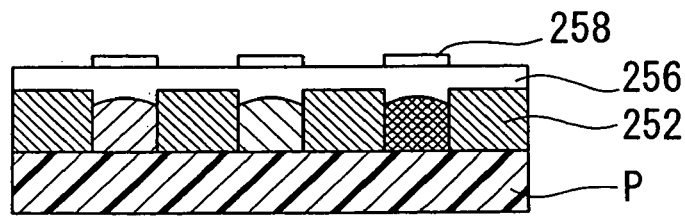

METHOD FOR FABRICATING PATTERN, APPARATUS FOR FABRICATING PATTERN, CONDUCTIVE FILM WIRING, METHOD FOR FABRICATING DEVICE, ELECTRO-OPTICAL APPARATUS, AND ELECTRONIC APPARATUS

This is a Division of application Ser. No. 10/409,210 filed Apr. 9, 2003 now U.S. Pat. No. 6,810,814. The entire disclosure of the prior application is hereby incorporated by reference herein in its entirety.

BACKGROUND OF THE INVENTION

1. Field of the Invention

The present invention relates to a method and an apparatus for fabricating a pattern on a substrate, in particular, the present invention relates to a process for fabricating a pattern on a substrate by ejecting a liquid material in the form of liquid droplets from a liquid droplet ejecting section.

2. Background Art

As a process for fabricating a pattern on a substrate, a process is known in which a film of liquid material for fabricating a pattern is formed on a substrate using a coating process such as the spin coat process, and the film is fabricated into a desired pattern using the photolithography process.

On the other hand, another process has been proposed in which a liquid material is disposed at desired positions on a substrate so as to directly fabricate a film pattern on the substrate. According to this process, fabrication steps relating to the photolithography process may be omitted or simplified.

As a process for disposing a liquid material at desired positions on a substrate, a process is known in which liquid droplets of the liquid material are ejected from nozzles provided in a liquid droplet ejecting section (refer to Japanese Unexamined Patent Application, First Publication No. Hei 11-274671, and Japanese Unexamined Patent Application, First Publication No. 2000-216330). The above process has advantages over a coating process such as the spin coating process in that the liquid material may be used with less loss, and it is easy to control the quantity and positions of the liquid material to be disposed on the substrate. In addition, this process is applicable even to a large substrate that may be difficult to handle in the spin coating process.

However, the process, in which a liquid material is disposed as liquid droplets onto a substrate, encounters a problem in that it is difficult to broaden the width of the film pattern. More specifically, when the volume of one droplet is increased, or when the total amount of the liquid material to be disposed on the substrate is increased in order to widen the film pattern, the performance of the pattern may be degraded due to irregularities at edge portions of the film pattern, and problems such as breakage or a short circuit may occur due to puddles (bulges) of liquid.

SUMMARY OF THE INVENTION

The present invention was conceived in view of the above circumstances, and the present invention provides a method and an apparatus for fabricating a pattern which makes it possible to obtain a wide pattern having edges of a preferable shape.

Another object of the present invention is to provide a conductive film wiring which is wide so as to be suitable for electrical conduction.

Another object of the present invention is to provide an electro-optical apparatus which has sufficient resistance against breaking of wires and short circuits, and to provide an electronic apparatus incorporating the electro-optical apparatus.

The present invention provides a method for fabricating a pattern, in which a liquid material is ejected as liquid droplets from a liquid droplet ejecting section, the method including the steps of: forming a plurality of first patterns on a substrate using the liquid droplets; and integrating the plurality of first patterns with each other by disposing the liquid droplets between the plurality of first patterns.

According to the above method for fabricating a pattern, a plurality of first patterns such as line patterns are formed on a substrate, and then the plurality of first patterns are integrated, thereby a wide pattern (film pattern) having edges of a preferable shape may be fabricated on the substrate.

More specifically, when the plurality of first patterns are formed on the substrate, the edges of the plurality of first patterns can be formed in a preferable shape having few irregularities by appropriately controlling the conditions for ejecting the droplets to be disposed on the substrate. A wide pattern can be fabricated by disposing the droplets between the plurality of first patterns so as to integrate the first patterns with each other.

In the above method for fabricating a pattern, the step of forming the plurality of first patterns and the step of integrating the plurality of first patterns may be performed by ejecting the liquid droplets using the liquid droplet ejecting section; ejecting by the liquid droplet ejecting section in the step of forming the plurality of first patterns and ejecting by the liquid droplet ejecting section in the step of integrating the plurality of first patterns may be performed under different conditions.

Accordingly, throughput may be increased.

If, for example, the volume of each of the liquid droplets used in the step of integrating the plurality of first patterns is set to be greater than that of each of the liquid droplets used in the step of forming the plurality of first patterns, or if the pitch between the liquid droplets disposed in the step of integrating the plurality of first patterns is set to be smaller than that between the liquid droplets disposed in the step of forming the plurality of first patterns, the plurality of first patterns may be integrated in a shorter time.

In the above method for fabricating a pattern, the height of the plurality of first patterns from the surface of the substrate may be preferably adjusted depending on the film thickness of the pattern to be fabricated.

In other words, the thickness of the pattern to be fabricated can be easily controlled by adjusting the height (thickness) of the plurality of first patterns. For example, the film thickness of the pattern may be easily increased by increasing the height of the plurality of first patterns.

The above method for fabricating a pattern may preferably include the step of making the surface of the substrate liquid-repellent before ejecting the liquid droplets onto the substrate. The liquid-repelling process which is referred to here is a treatment for providing non-affinity with respect to the liquid material.

As a result, expansion of the liquid droplets, which are disposed on the substrate, may be restrained, and thus the thickness of the pattern may be increased, and the shape of the pattern may be stabilized.

The liquid material may preferably include a liquid substance having conductive fine particles.

In apparatus for fabricating a pattern on a substrate according to the present invention includes an ejecting section for ejecting a liquid material as liquid droplets, wherein the pattern is formed on the substrate using the method described above.

According to the apparatus for fabricating a pattern, a wide pattern may be fabricated without losing the preferable shape of the edges.

he present invention further provides a conductive film wiring which is fabricated using the above apparatus for fabricating a pattern.

The conductive film wiring may be made wide so as to be preferable in terms of electrical conductivity.

The present invention further provides a method for fabricating a device that includes a substrate and a conductive film wiring formed on the substrate. The method includes the step of forming a pattern on the substrate by ejecting a liquid material as liquid droplets from a liquid droplet ejecting section, wherein the step of forming a pattern includes the steps of forming a plurality of first patterns that are substantially parallel to each other by disposing the liquid droplets on the substrate; and integrating the plurality of first patterns with each other by disposing the liquid droplets between the plurality of first patterns.

According to the method for fabricating a device, a plurality of first patterns are formed on a substrate, and then the plurality of first patterns are integrated, thereby a wide pattern (film pattern) having edges of a preferable shape may be fabricated on the substrate.

The present invention further provides an electro-optical apparatus which includes the above conductive film wiring. The electro-optical apparatus may be, for example, a plasma display, a liquid crystal display, or an organic electroluminescent display.

The present invention further provides an electronic apparatus including the above electro-optical apparatus.

According to the present invention, the electro-optical apparatus and the electronic apparatus include conductive film wirings which are advantageous for electrical conductivity; therefore, breakage and short circuits in the wirings may not easily occur.

BRIEF DESCRIPTION OF THE DRAWINGS

FIGS. 1A and 1B show an example of processes for fabricating line-shaped conductive film patterns on a substrate.

FIGS. 14A to 14F are schematic diagrams showing the color filter to which a method for fabricating a device according to the present invention is applied.

DETAILED DESCRIPTION OF THE PREFERRED EMBODIMENTS

Figure 1A:
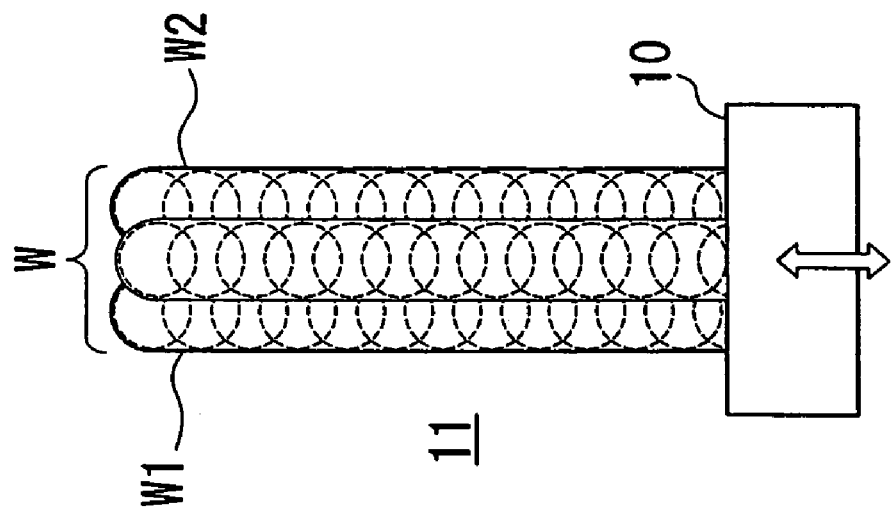
FIGS. 1A and 1B show an embodiment of a method for fabricating a pattern according to the present invention; in particular.

Next, a method for fabricating a conductive film wiring on a substrate, which is as an example of the embodiments of the present invention, will be explained. In the method for fabricating a wiring according to the present embodiment, a liquid material for forming a conductive film wiring is disposed on a substrate, and a conductive film pattern for wiring is fabricated on the substrate. The method includes a surface treatment process, a material disposing process, and a heat treatment and optical treatment process. Disposing of the liquid material is conducted using a liquid droplet ejecting device, by which a liquid disposing process, i.e., a so-called ink-jet process, in which the liquid material is ejected as liquid droplets from nozzles of an ejecting head, is carried out. The ejecting method employed in the liquid droplet ejecting device may be a piezo-jet method in which a liquid material (fluid) is ejected due to a volume change of a piezoelectric element, a method in which a liquid material is ejected by being instantly vaporized due to heat, or the like.

As a substrate on which a conductive film wiring is formed, various types of material may be used such as glass, silica glass, a silicon wafer, a plastic film, or a metal plate. The substrate may be of a type having a base substrate and a backing layer such as a semi-conductive film, a metal film, a dielectric film, or an organic film that is formed on the base substrate.

In this embodiment, a dispersion liquid (a liquid substance), which includes a dispersion medium and conductive fine particles that are dispersed in the dispersion medium, is used as the liquid material for forming a conductive film wiring. The liquid material may be either an aqueous liquid or an oleaginous liquid. The conductive fine particles may be metal fine particles including one of gold, silver, copper, palladium, and nickel, as well as fine particles of conductive polymer, or fine particles of a superconductor.

The surfaces of the conductive fine particles may be coated with an organic substance or the like in order to improve the dispersion performance of the particles. The coating material used for coating the surfaces of the conductive fine particles may be, for example, an organic solvent such as xylene or toluene, citric acid, etc.

The sizes of the conductive fine particles may preferably be set in a range between 5 nm and 0.1 μm. When the sizes of the conductive fine particles are set to be greater than 0.1 μm, the nozzles of the liquid ejecting head may become clogged. When the sizes of the conductive fine particles are set to be less than 5 nm, the volume ratio of the coating material with respect to the conductive fine particles is increased, and the organic substance contained in the obtained film may be too much.

The liquid dispersion medium containing the conductive fine particles may preferably have a vapor pressure at room temperature between 0.001 mmHg and 200 mmHg (approximately between 0.133 Pa and 26,600 Pa). If the vapor pressure of the liquid dispersion medium is greater than 200 mmHg, the dispersion medium is instantly vaporized after being ejected, which may make the forming of a preferable film difficult.

The vapor pressure of the dispersion medium may more preferably be set in a range between 0.001 mmHg and 50 mmHg (approximately between 0.133 Pa and 6650 Pa). If the vapor pressure of the liquid dispersion medium is greater than 50 mmHg, the nozzles may easily become clogged due to drying in the case in which liquid droplets are ejected using the ink-jet method.

If the vapor pressure of the liquid dispersion medium is less than 0.001 mmHg, the dispersion medium may remain in the formed film because drying takes a long time, and a high-grade film may not be obtained after the heat and/or optical treatment.

The dispersion medium is not limited to a specific type as long as it is possible to disperse the conductive fine particles without causing aggregation. The dispersion medium may be, for example, other than water, an alcohol group such as methanol, ethanol, propanol, or butanol; a hydrocarbon compound such as n-heptane, n-octane, decane, toluene, xylene, cymene, durene, indene, dipentene, tetrahydronaphthalene, decahydronaphthalene, or cyclohexylbenzene; an ether compound such as ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, 1,2-dimethoxyethane, bis(2-methoxyethyl) ether, or p-dioxane; or a polar compound such as propylene carbonate, γ-butyrolactone, N-methyl-2-pyrrolidone, dimethyl formamide, dimethyl sulfoxide, or cyclohexanone. In the above group, water, an alcohol group, a hydrocarbon compound, and an ether compound are preferred, and more preferred dispersion mediums are water and a hydrocarbon compound in view of the dispersion performance of the particles, stability of the dispersion liquid, and ease of application to the ink-jet method. Of these mediums, one medium may be used alone, or a mixture of two or more mediums may be used.

When the conductive fine particles are dispersed in a dispersion medium, the dispersoid concentration may preferably be set in a range between 1% by mass and 80% by mass, and the dispersoid concentration may be adjusted depending on the film thickness. Note that when the dispersoid concentration is set to be greater than 80% by mass, aggregation tends to occur, and it is difficult to obtain a uniform film.

The surface tension of the dispersion liquid containing the conductive fine particles may preferably be set in a range between 0.02 N/m and 0.07 N/m. In the case in which liquid is ejected using the ink-jet method, when the surface tension is set to be less than 0.02 N/m, the trajectory of the liquid tends to curve because the wettability of the ink composition with respect to the nozzle surface is increased, and when the surface tension is set to be greater than 0.07 N/m, it is difficult to control the amount of ejection and the timing of ejection because the shape of the meniscus at the nozzle end is not stable.

In order to adjust the surface tension, a vary small amount of a surface tension modifier such as a fluorine system, silicone system, or nonion system may preferably be added to the dispersion liquid to an extent that does not significantly decrease the contact angle with respect to the substrate. The surface tension modifier of a nonion system improves wettability of the liquid with respect to the substrate, and contributes to the prevention of small irregularities in the film.

The dispersion liquid may include organic compounds such as alcohol, ether, ester, or ketone if necessary.

The viscosity of the dispersion liquid may preferably be set in a range between 1 mPa·s and 50 mPa·s. In the case in which the liquid material is ejected as liquid droplets using the ink-jet method, when the viscosity is less than 1 mPa·s, portions around the nozzles tend to become dirty due to discharged ink, and when the viscosity is greater than 50 mPa·s, the nozzles may frequently become clogged, and it is difficult to smoothly perform ejection of the droplets.

Moreover, as the liquid material for the conductive film wiring, a liquid material containing an organometallic compound, an organometallic complex, or the like may be used. An example of the organometallic compound is an organosilver compound. A solution in which the organosilver compound is dispersed (or dissolved) in a predetermined solvent may be used as the liquid material for the conductive film wiring. In this case, diethyleneglycol diethyl ether may be used as the solvent. When an organosilver compound (organometallic compound) is used as the liquid material, the organic constituent thereof is removed by a heat treatment or an optical treatment, and silver particles (metal particles) remain, and thus conductivity is obtained.

Surface Treatment Process

In a surface treatment process, the surface of the substrate on which the conductive film wiring is formed is processed so as to become liquid-repellent with respect to the liquid material. More specifically, a surface treatment is applied to the substrate so that a predetermined contact angle with respect to the liquid material that contains the conductive particles is equal to or greater than 60 degrees, and preferably, in a range between 90 degrees and 110 degrees.

As the process for controlling the liquid-repellent performance (wettability) of the surface, for example, a process for forming a self-organizing film, a plasma treatment, or the like may be employed.

In the process for forming a self-organizing film, a self-organizing film consisting of an organic molecular film or the like is formed on the surface of the substrate on which the conductive film wiring is to be fabricated.

The organic molecular film for treatment of the surface of the substrate includes a functional group to be bound with the substrate, another functional group for reforming the surface (for controlling surface energy) of the substrate such as a group having liquid-affinity, a liquid-repellent group, or the like disposed at the side opposite to the functional group, and a straight carbon chain or a partially branching carbon chain that binds these functional groups together. The organic molecular film binds with the substrate and self-organizes so as to form a molecular film such as a monomolecular film.

The self-organizing film herein referred to includes a functional group that is to react with constituent atoms of a backing layer or the like of the substrate, and straight chain molecules. The self-organizing film is formed by orienting compounds that have an extremely high orientation due to interaction between the straight chain molecules. Because the self-organizing film is formed by orienting single molecules, an extremely small film thickness can be obtained, and in addition, the film is quite uniform as viewed on the scale of molecular size. In other words, because the same type of molecules are positioned at the surface of the film, a uniform and superior liquid-repellency or liquid-affinity may be provided on the surface of the film.

For example, by using fluoroalkylsilane as the compound having a high orientation, the compounds are oriented such that each fluoroalkyl group thereof is positioned at the surface of the film so that a self-organizing film is formed, and thus a uniform liquid-repellency is provided on the surface of the film.

The compound for forming the self-organizing film may be, for example, fluoroalkylsilane (hereinafter referred to as "FAS") such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, or trifluoropropyltrimethoxysilane. Of these compounds, one compound may be used alone, or two or more compounds may be combined and used. By using FAS, adhesion between the film and the substrate, and a preferable liquid-repellency can be obtained.

In general, FAS is expressed by the structural formula $R_nSiX_{(4-n)}$. In this formula, "n" indicates an integer from 1 to 3, and "X" indicates a hydrolysis group such as a methoxy group, ethoxy group, or halogen atom. "R" indicates a fluoroalkyl group having the structure of $(CF_3)(CF_2)_x(CH_2)_y$, where "x" indicates an integer from 0 to 10, "y" indicates an integer from 0 to 4, and in the case in which a plurality of "R"s and "X"s are binded with Si, the "R"s may be the same or different with respect to each other, and the "X"s may be the same or different with respect to each other.

The hydrolysis group expressed by "X" forms silanol by hydrolysis, and reacts with a hydroxyl group of the backing layer on the substrate (glass or silicon) so as to bind with the substrate in a siloxane bond. On the other hand, because "R" has a fluoro group such as $(CF_3)$ on the surface thereof, "R" reforms the surface of the backing layer on the substrate into a surface that will not get wet (i.e., a surface with low surface energy).

The self-organizing film of an organic molecular film or the like is formed on the substrate by placing the above-mentioned source compounds and the substrate into a sealed container, and leaving them to stand for 2 to 3 days at room temperature. Alternatively, by maintaining the entire sealed container at 100° C., the self-organizing film is formed on the substrate in approximately 3 hours. In these processes, the self-organizing film is formed from a gas phase; however, the self-organizing film may be formed from a liquid phase. For example, the self-organizing film is formed on a substrate through the steps of dipping the substrate in a solution containing the source compounds, and rinsing and drying the substrate.

Before forming the self-organizing film, a pretreatment may be preferably applied to the surface of the substrate in such a manner that ultraviolet radiation is applied to the surface of the substrate, or the surface of the substrate is cleaned using a solvent.

In the case of employing a plasma treatment, plasma is radiated onto the substrate under normal pressure or in a vacuum condition. The type of gas used in the plasma treatment may be selected from various types taking into account the surface material of the substrate on which the conductive film wiring is to be fabricated. The treatment gas may be, for example, tetrafluoromethane, perfluorohexane, perfluorodecane, or the like.

The process for making the surface of the substrate liquid-repellent may be performed by adhering a film having a desired liquid-repellency, e.g., a polyimide film having been processed with tetrafluoroethylene, onto the surface of the substrate. Alternatively, a polyimide film having a high liquid-repellency may be used as it is as the substrate.

When the surface of the substrate has a liquid-repellency which is higher than a desired liquid-repellency, the wettability of the surface of the substrate may be preferably controlled by applying a treatment for giving the surface of the substrate liquid-affinity in such a manner that ultraviolet radiation of 170 to 400 nm is applied to the surface, or the substrate is exposed to an ozone atmosphere.

Material Disposing Process

Figure 1B:
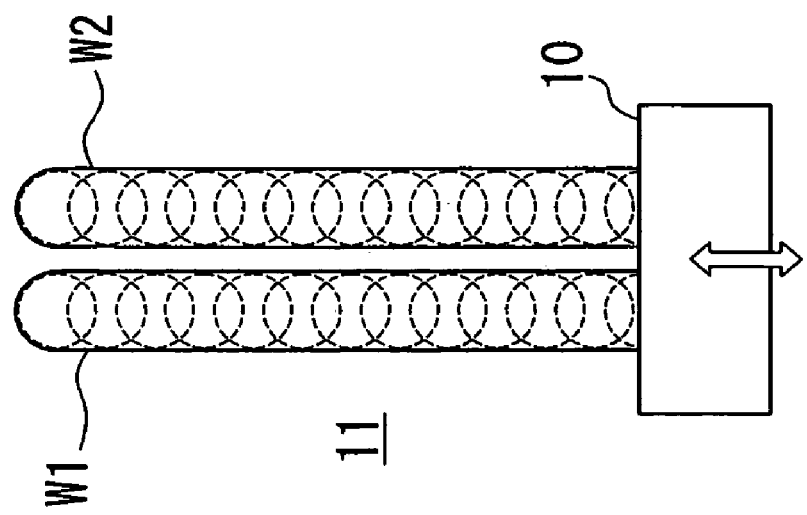

FIGS. 1A and 1B show, as an example of processes for disposing a liquid material on a substrate, an example of procedures for fabricating line-shaped conductive film patterns on a substrate.

The material disposing process includes a first step (FIG. 1A) in which a plurality of line-shaped conductive film patterns (first patterns) are formed on the substrate, and a second step (FIG. 1B) in which the line-shaped patterns are integrated with each other. Hereafter, the details of the process will be explained.

In the first step, as shown in FIG. 1A, a liquid material is ejected as liquid droplets from a liquid ejecting head 10, and the liquid droplets are disposed on a substrate 11 at a constant interval (pitch). By repeating the process for disposing liquid droplets, a plurality of line-shaped patterns W1 and W2 (two patterns in this example) are formed on the substrate 11.

Figure 2A:
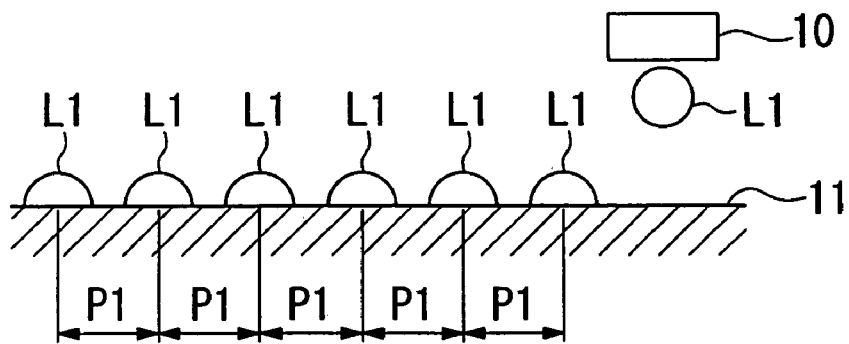
FIGS. 2A to 2C more specifically show the processes for fabricating line-shaped patterns.
Figure 2B:
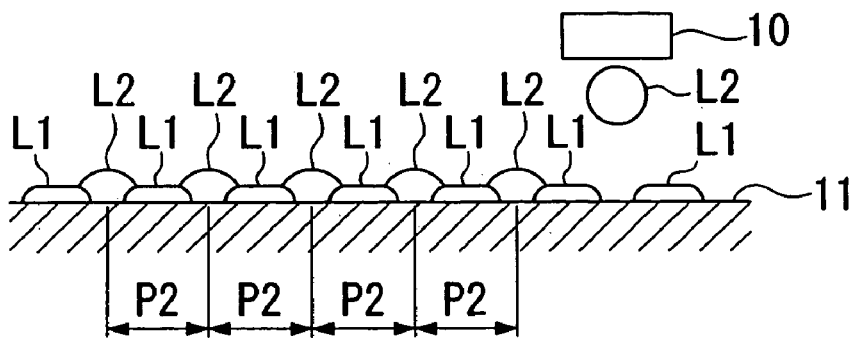
Figure 2C:
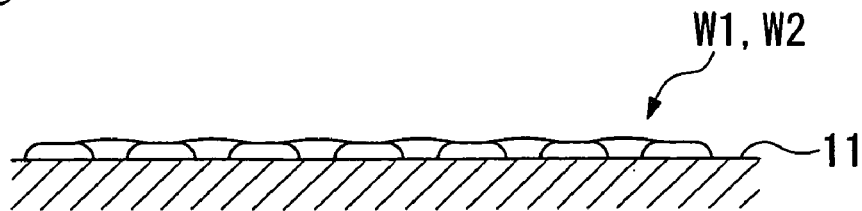

FIGS. 2A to 2C more specifically show the processes for fabricating the line-shaped patterns in the first step.

As shown in FIG. 2A, liquid droplets L1 ejected from the liquid ejecting head 10 are sequentially disposed on the substrate 11 at a constant interval. In this example, the disposing pitch P1 between the liquid droplets L1 is set to be greater than the diameter of each of the droplets L1 as measured immediately after disposition on the substrate 11. As a result, the liquid droplets L1 do not contact each other immediately after disposition on the substrate 11, and the liquid droplets L1 are prevented from integrating with each other so as not to expand on the substrate 11. Moreover, the disposing pitch P1 between the liquid droplets L1 is set to be equal to or less than two times the diameter of each of the droplets L1 as measured immediately after disposition on the substrate 11.

After disposing the liquid droplets L1 on the substrate 11, a drying process is carried out, if necessary, in order to remove the dispersion medium. The drying process may be performed by a conventional heating process in which, for example, a hot plate, an electric furnace, a hot blast generator, or the like is used as a heating means. Other than such a conventional heating process, the drying process may also be performed using a lamp annealing process. The light source for the lamp annealing process is not limited, and an infrared lamp, a xenon lamp, a YAG laser, an argon laser, a carbon dioxide laser, an excimer laser such as XeF, XeCl, XeBr, KrF, KrCl, ArF, or ArCl, or the like may be employed. In general, the output power of such a light source is set to be in a range between 10 W and 5000 W, and in the case of this embodiment, 100 W to 1000 W may be sufficient.

In the above drying process, the intensity of heating or optical radiation may be increased so that not only is the dispersion medium removed but also the dispersion liquid is converted into a conductive film. However, because the conversion into the conductive film can be performed entirely in the heat treatment/optical treatment processes after completing disposition of the entire liquid material, removal of the dispersion medium to some extent will suffice in this stage. For example, in the case of performing a heat treatment, heating at approximately 100° C. for a few minutes will be generally sufficient.

The drying process may progress simultaneously with the ejection process of the liquid material. Drying of the liquid droplets may be started immediately after ejecting the same liquid droplets by, for example, heating the substrate in advance, or by using a dispersion medium having a low boiling point while cooling the liquid ejecting head.

Next, as shown in FIG. 2B, the above operation for disposing the liquid material is repeated. More specifically, similar to the previous process shown in FIG. 2A, the liquid material is ejected as liquid droplets L2 from the liquid ejecting head 10, and the liquid droplets L2 are disposed on the substrate 11 at a constant interval.

In this case, the volume of each of the liquid droplets L2 (the amount of the liquid material per droplet) and a disposing pitch P2 are set to be the same as for the case of the previous liquid droplets L1. The disposing positions of the liquid droplets L2 are shifted by a half pitch with respect to the liquid droplets L1 so that the liquid droplets L2 in this process are disposed at the midpoints between each of the liquid droplets L1.

As mentioned above, the disposing pitch P1 between the liquid droplets L1 is set to be greater than the diameter of each of the liquid droplets L1 as measured immediately after disposition on the substrate 11, and is set to be equal to or less than two times the diameter of each of the liquid droplets L1. As a result, the liquid droplets L2 are disposed at the midpoints between each of the liquid droplets L1, whereby each of the liquid droplets L2 partially overlaps the liquid droplets L1, and the spaces between the liquid droplets L1 are filled.

In this case, the liquid droplets L2 disposed in this process contact the liquid droplets L1 disposed in the previous process; however, because the dispersion medium in the liquid droplets L1 disposed in the previous process have been completely or partially removed, the liquid droplets L2, together with the liquid droplets L1, will not expand on the substrate 11.

In FIG. 2B, the disposing of the liquid droplets L2 is started from the same side as in the previous process (i.e., the left-hand in FIG. 2B); however, the disposing of the liquid droplets L2 may be started at the opposite side (i.e., at the right-hand in FIG. 2B). The total distance of the relative movements between the liquid ejecting head 10 and the substrate 11 may be reduced by performing ejection of the liquid droplets during every movement of the reciprocation of the liquid ejecting head 10.

After disposing the liquid droplets L2 on the substrate 11, a drying process is carried out as in the previous process, if necessary, in order to remove the dispersion medium. In this case as well, the intensity of heating or optical radiation may be increased so that not only is the dispersion medium removed but also the dispersion liquid is converted into a conductive film; however, removal of the dispersion medium to some extent will suffice in this stage.

By repeating these sequential operations for disposing the liquid droplets multiple times, the spaces between the liquid droplets disposed on the substrate 11 are filled, and continuous line-shaped patterns (line-shaped patterns W1 and W2) are formed on the substrate 11 as shown in FIG. 2C. In this case, by increasing the number of repetitions of operations for disposing the liquid droplets, the liquid droplets are superimposed one after another on the substrate 11, and the film thicknesses of the line-shaped patterns W1 and W2, i.e., the heights (thicknesses) of the line-shaped patterns W1 and W2 from the surface of the substrate 11 are increased. The heights (thicknesses) of the line-shaped patterns W1 and W2 are determined in accordance with a desired film thickness that is needed for the final film patterns, and the number of repetitions of operations for disposing the liquid droplets is determined accordingly.

The process for fabricating the line-shaped patterns is not limited to the process shown in FIGS. 2A to 2C. For example, the disposing pitch and the amount of shifting during the repetitions may be freely set.

Now referring to FIG. 1A again, the conditions for ejecting liquid droplets, and more specifically, the volume of each of the droplets and the disposing pitch between the liquid droplets are determined so that the edges of the line-shaped patterns W1 and W2 formed on the substrate 11 exhibit a preferable shape having few irregularities. Because the surface of the substrate 11 has been given liquid-repellency, expansion of each of the liquid droplets disposed on the substrate 11 is restrained. Accordingly, the shape of the edges of the line-shaped patterns can be reliably controlled to be in the preferable state mentioned above, and the film thickness may be easily increased.

The line-shaped patterns W1 and W2, i.e., two line-shaped patterns, may be formed simultaneously, or may be formed one by one. When the line-shaped patterns W1 and W2 are formed one by one, the total number of the drying processes may increase as compared with the case in which two line-shaped patterns are formed simultaneously; therefore, the drying condition may preferably be determined so as not to lose the liquid-repellency of the substrate 11.

In this example, the line-shaped patterns W1 and W2 are disposed so as to be separated from each other; however, the line-shaped patterns W1 and W2 may be disposed so as to partially overlap each other.

Next, in the second step, as shown in FIG. 1B, the liquid material is ejected as liquid droplets from the liquid ejecting head 10 so that the liquid droplets are disposed between the line-shaped patterns W1 and W2, whereby the line-shaped patterns W1 and W2 are integrated with each other.

Figure 3C:
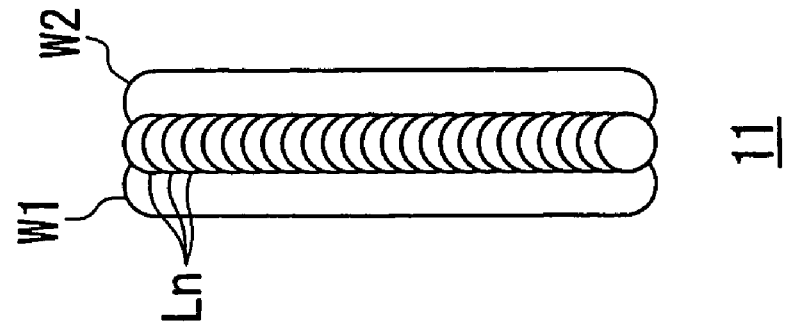
FIGS. 3A to 3C show the processes for disposing liquid droplets between a plurality of line-shaped patterns.
Figure 3B:
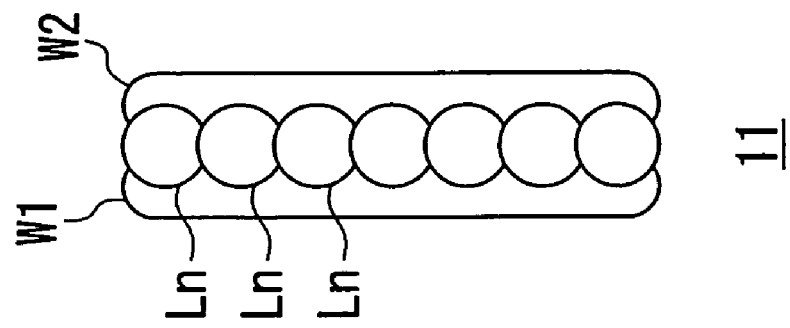
Figure 3A:
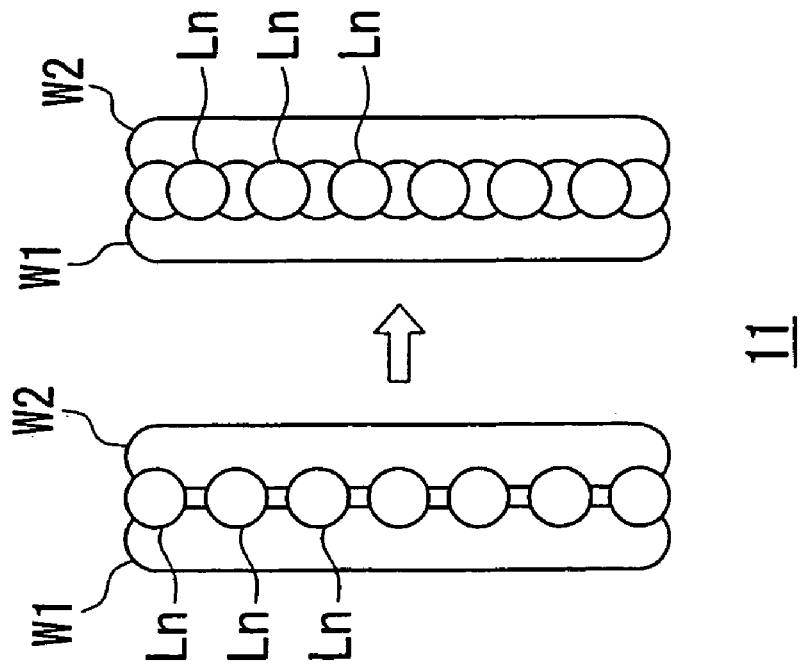

FIGS. 3A to 3C respectively show examples of processes for disposing liquid droplets between the line-shaped patterns W1 and W2.

In the example shown in FIG. 3A, liquid droplets Ln are disposed between the line-shaped patterns W1 and W2 under the same ejecting conditions as in the first step explained above. More specifically, the liquid droplets Ln are disposed between the line-shaped patterns W1 and W2 under the same conditions as in the first step in terms of the volume and the disposing pitch, and the disposing operation is repeated multiple times. Because, between the line-shaped patterns W1 and W2, a concave portion is formed that is delimited by the line-shaped patterns W1 and W2 acting as walls, the liquid droplets Ln are accommodated in the concave portion one by one.

The operation for disposing the liquid droplets is repeated until, for example, the concave portion is filled with the liquid droplets (liquid material). In the second step, the drying process, which is performed in order to remove the dispersion medium as in the first step, may be applied during every operation for disposing the liquid droplet that is repeated one after another; however, the drying process may be omitted. In particular, in the second step, the liquid droplets will not expand on the substrate 11 due to the line-shaped patterns W1 and W2 that act as walls even when the liquid droplets overlap each other before being dried. Throughput may be increased by omitting the drying process.

In the example shown in FIG. 3B, the ejecting conditions are set differently from the first step, i.e., the volume of each of the liquid droplets Ln is set to be greater than that in the first step. In other words, the amount of the liquid material to be ejected at one time is increased. In this example, the disposing pitch between the liquid droplets Ln is set to be the same as in the first step. By increasing the volume of each of the liquid droplets Ln, the concave portion formed by the line-shaped patterns W1 and W2 is filled with the liquid droplets in a shorter time.

Now referring to FIG. 1B again, the liquid droplets are disposed between the line-shaped patterns W1 and W2, and the concave portion therebetween is filled with the liquid droplets (liquid material), whereby the line-shaped patterns W1 and W2 are integrated with each other so as to form a single line-shaped pattern W. Because the width of the line-shaped pattern W covers the widths of the line-shaped patterns W1 and W2 that were previously formed, increasing of the width is thus achieved.

In this case, the width of the completed line-shaped pattern W is determined depending on the distance between the line-shaped patterns W1 and W2. In other words, the width of the integrated and completed line-shaped pattern W can be controlled by adjusting the distance between the line-shaped patterns W1 and W2 that are formed in the first step.

Moreover, the film thickness of the integrated line-shaped pattern W can be controlled by adjusting the heights from the surface of the substrate (thicknesses) of the line-shaped patterns W1 and W2 that are formed in the first step. For example, by increasing the heights of the line-shaped patterns W1 and W2 that are formed in the first step, the film thickness of the integrated line-shaped pattern W can be easily increased.

In this example, two line-shaped patterns are formed in the first step; however, three or more line-shaped patterns may be formed. By increasing the number of line-shaped patterns to be integrated, a line-shaped pattern having a greater width may be easily formed.

Heat Treatment/Optical Treatment Process

In the heat treatment/optical treatment process, the dispersion medium or a coating material contained in the liquid droplets disposed on the substrate is removed. More specifically, the dispersion medium contained in the liquid material for forming a conductive film must be completely removed in order to improve electrical contacts among the fine particles. In addition, when the surface of the conductive fine particles is coated with a coating material such as an organic substance in order to improve the dispersion performance of the particles, the coating material must be removed as well.

In general, the heat treatment and/or optical treatment are performed under a normal atmosphere; however, the heat treatment and/or optical treatment may be performed in an inert gas atmosphere such as nitrogen, argon, or helium, if necessary. The temperature at which the heat treatment and/or optical treatment are performed is appropriately determined taking into account the boiling point (vapor pressure) of the dispersion medium, type and pressure of the atmospheric gas, the thermal behavior, such as dispersion performance, oxidizing properties, or the like of the fine particles, existence or quantity of the coating material, the thermal resistance of the substrate, etc.

For example, a heating treatment at approximately 300° C. is required in order to remove a coating material of an organic substance. When a substrate of plastic or the like is used, the heating treatment process may be preferably performed at a temperature between room temperature and 100° C.

The heat treatment and/or optical treatment may be performed by a conventional heating process in which, for example, a hot plate, an electric furnace, or the like is used as a heating means. Other than such a conventional heating process, the drying process may also be performed using a lamp annealing process. The light source for the lamp annealing process is not limited, and an infrared lamp, a xenon lamp, a YAG laser, an argon laser, a carbon dioxide laser, an excimer laser such as XeF, XeCl, XeBr, KrF, KrCl, ArF, or ArCl, or the like may be employed. In general, the output power of such a light source is set to be in a range between 10 W and 5000 W, and in the case of this embodiment, 100 W to 1000 W may be sufficient.

By the above heat treatment and/or optical treatment, electrical contacts between the fine particles are ensured, and the fine particles are converted into a conductive film.

Through the series of processes explained above, the line-shaped conductive film pattern is fabricated on the substrate. According to the process for fabricating a wiring in this embodiment, widening of the line-shaped pattern may be achieved by fabricating a plurality of line-shaped patterns and by integrating them even when a limitation is applied to the width of the line-shaped pattern that is fabricated in one process. In this case, the preferable shape of the edges of the line-shaped patterns that are formed in the previous step may not be lost, and may be maintained as they are. Moreover, the width and film thickness of the completed line-shaped pattern can be controlled by adjusting the distance between the line-shaped patterns and the heights thereof from the surface of the substrate that are formed in the previous step. Accordingly, a conductive film pattern may be fabricated which is easily made wide and thick, which is preferable for electrical transmission, and in which problems such as breaking of wires, short circuits, or the like may not easily occur.

Next, as an example of an apparatus for fabricating a pattern according to the present invention, an apparatus for fabricating wirings, which embodies the above process for fabricating wirings, will be explained.

Figure 4:
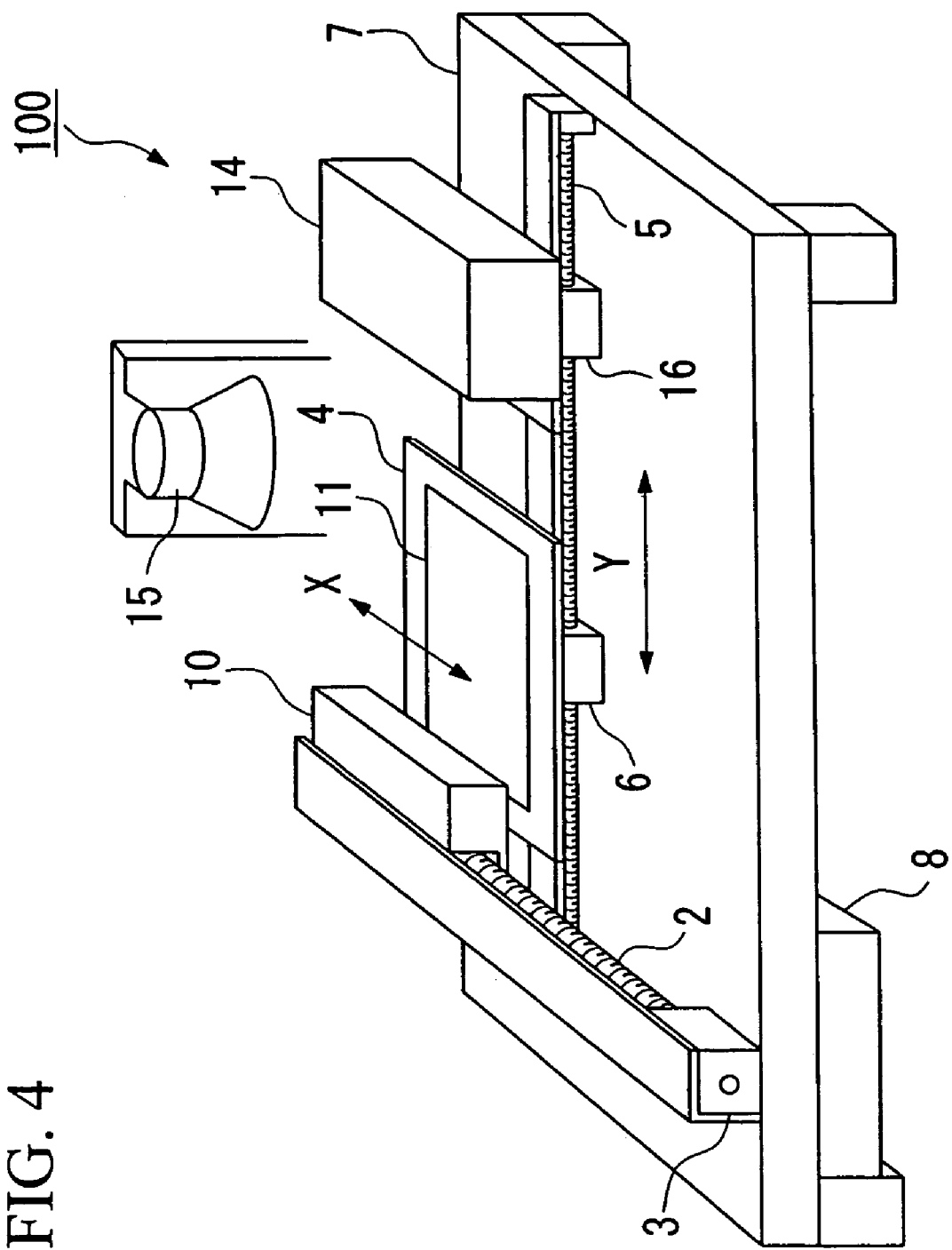
FIG. 4 is a schematic perspective view showing a wire fabricating apparatus as an embodiment of an apparatus for fabricating a pattern according to the present invention.

FIG. 4 is a schematic perspective view showing an apparatus for fabricating wirings according to the present embodiment. As shown in FIG. 4, a wiring fabrication apparatus 100 includes a liquid ejecting head 10, an x-direction guide shaft 2 for moving the liquid ejecting head 10 in the x-direction, an x-direction drive motor 3 for rotating the x-direction guide shaft 2, a supporting plate 4 for supporting a substrate 11, a y-direction guide shaft 5 for moving the supporting plate 4 in the y-direction, a y-direction drive motor 6 for rotating the y-direction guide shaft 5, a cleaning mechanism 14, a heater 15, and a control device 8 for overall control of these elements. The x-direction guide shaft 2 and y-direction guide shaft 5 are provided on a base 7. As shown in FIG. 4, the liquid ejecting head 10 is perpendicularly arranged with respect to the direction of movement of the substrate 11; however, the disposition angle of the liquid ejecting head 10 may be adjusted so that the liquid ejecting head 10 is obliquely arranged with respect to the direction of movement of the substrate 11. In such an arrangement, the pitch between nozzles of the liquid ejecting head 10 can be changed by adjusting the disposition angle of the liquid ejecting head 10. Moreover, a configuration may be employed in which the distance between the substrate 11 and a nozzle face of the liquid ejecting head 10 can be freely adjusted.

The liquid ejecting head 10, which is fixed to the x-direction guide shaft 2, ejects a liquid material of dispersion liquid containing conductive fine particles from the nozzles (ejecting holes). The x-direction drive motor 3, which is a stepping motor or the like, rotates the x-direction guide shaft 2 upon receiving x-direction driving pulse signals from the control device 8. When the x-direction guide shaft 2 is rotated, the liquid ejecting head 10 moves in the x-direction with respect to the base 7.

As a method for ejecting liquid, any known methods may be employed such as a piezo method in which piezoelectric elements are used for ejecting ink, a bubble method in which a liquid material is heated so as to produce vapor, and the liquid material is ejected using the vapor, etc. Among such known methods, the piezo method is preferable because heat, which may have an effect on the composition of the liquid material, is not applied to the liquid material. In this example, the piezo method is used due to a high degree of freedom in selection of the liquid material, and due to the ease of control of the liquid droplets.

The supporting plate 4 is provided on the y-direction guide shaft 5. The y-direction drive motors 6 and 16 are connected to the y-direction guide shaft 5. The y-direction drive motors 6 and 16, which are stepping motors or the like, rotate the y-direction guide shaft 5 upon receiving y-direction driving pulse signals from the control device 8. When the y-direction guide shaft 5 is rotated, the supporting plate 4 moves in the y-direction with respect to the base 7.

The cleaning mechanism 14 is provided for cleaning the liquid ejecting head 10 so as to prevent clogging of the nozzles. The cleaning mechanism 14 is moved by the y-direction drive motor 16 along the y-direction guide shaft 5 for a cleaning operation.

The heater 15, which includes a heating means such as a lamp annealing device or the like, is provided for applying a heat treatment process to the substrate 11, in which the liquid material ejected onto the substrate is vaporized and dried so that the liquid material is converted into a conductive film.

In the wiring fabrication apparatus 100, the liquid material is disposed on the substrate 11 in such a manner that the substrate 11 and the liquid ejecting head 10 are moved with respect to each other by means of the x-direction drive motor 5 and/or the y-direction drive motor 6 while the liquid material is ejected from the liquid ejecting head 10.

The amount of liquid droplets ejected from each of the nozzles of the liquid ejecting head 10 is controlled by adjusting the voltage supplied from the control device 8 to the piezoelectric elements.

Moreover, the pitch between the liquid droplets to be disposed on the substrate 11 is controlled by adjusting the speed of the above-mentioned relative movement and by adjusting the frequency of ejection from the liquid ejecting head 10 (i.e., frequency of the driving voltage supplied to the piezoelectric elements).

The position at which the ejection of the liquid droplets onto the substrate begins is controlled by setting of the direction of the above-mentioned relative movement, by a timing control for start of ejection of the liquid droplets from the liquid ejecting head 10 during the above-mentioned relative movement, and by other measures.

Accordingly, the above-mentioned conductive film pattern for wiring is fabricated on the substrate 11.

ext, a plasma display will be explained as an example of an electro-optical apparatus of the present invention.

Figure 5:
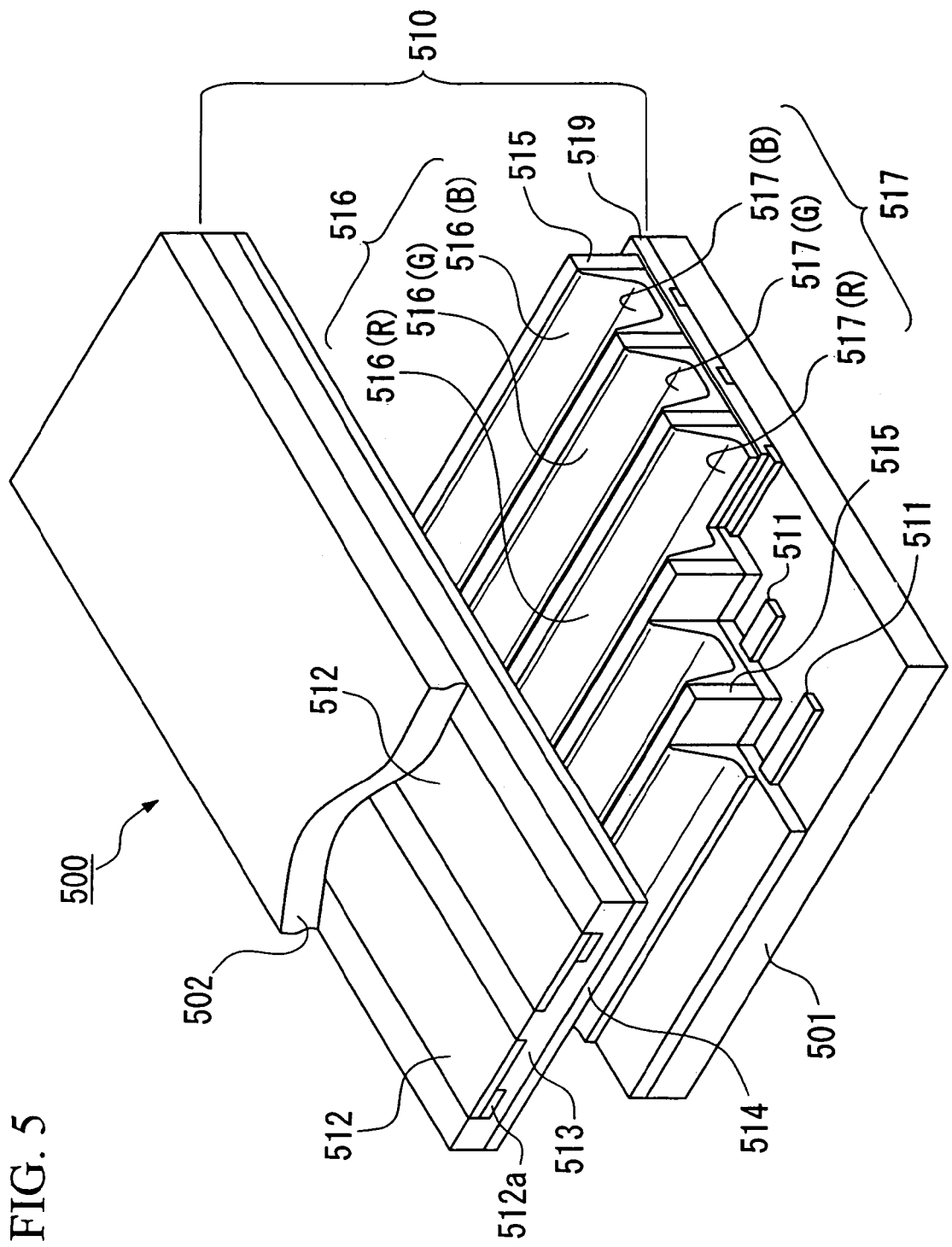
FIG. 5 is an exploded perspective view showing an example in which an electro-optical apparatus of the present invention is applied to a plasma display.

FIG. 5 is an exploded perspective view showing a plasma display 500 according to the present embodiment.

The plasma display 500 includes substrates 501 and 502 which are arranged so as to face each other, and a discharge display section 510 disposed between the substrates 501 and 502.

The discharge display section 510 includes a plurality of discharge chambers 516. A red discharge chamber 516 (R), a green discharge chamber 516 (G), and a blue discharge chamber 516 (B), which are included in the discharge chambers 516, are arranged as a set so as to form one pixel.

On the substrate 501, there are formed address electrodes 511 that are arranged like stripes having a predetermined interval therebetween, and a dielectric layer 519 that covers the address electrodes 511 and the upper surface of the substrate 501. On the dielectric layer 519, there are formed partition walls 515 each of which is disposed between two address electrodes 511 and along each of the address electrodes 511. The partition walls 515 include a pair of partition walls that are arranged adjacent to each other at two sides as viewed in the width direction one of the address electrodes 511, and partition walls that extend perpendicular to the address electrodes 511. Each of the discharge chambers 516 is formed corresponding to a rectangular region that is delimited by the partition walls 515.

In each of the rectangular regions that are delimited by the partition walls 515, there is provided a fluorescent element 517. Each fluorescent element 517 emits one of red, green, and blue fluorescent lights. A red fluorescent element 517(R) is disposed at the bottom of the red discharge chamber 516 (R), a green fluorescent element 517(G) is disposed at the bottom of the green discharge chamber 516(G), and a blue fluorescent element 517(B) is disposed at the bottom of the blue discharge chamber 516(B).

On the other hand, under the substrate 502, there are formed display electrodes 512 that are arranged like stripes having a predetermined interval therebetween. Moreover, there are formed a dielectric layer 513, which covers the display electrodes 512 and the underside of the substrate 502, and a protection layer 514 of MgO or the like.

The substrate 501 and the substrate 502 are adhered to each other in such a manner that the address electrodes 511 and the display electrodes 512 are arranged perpendicular to each other while facing each other.

The address electrodes 511 and the display electrodes 512 are connected to an alternating current source (not shown). When electrical power is supplied to each of the electrodes, the fluorescent elements 517 in the discharge display section 510 are excited and emit light, whereby displaying of colors is achieved.

In this embodiment, the address electrodes 511 and the display electrodes 512 are fabricated using the wiring fabrication apparatus shown in FIG. 4, and using the method for fabricating wirings shown in FIGS. 1A and 1B. Accordingly, the above-mentioned electrodes and the like may not easily have problems such as breakage or a short circuit, and it is easy to make the display device to be compact and thin.

Next, a liquid crystal display will be explained as another example of an electro-optical apparatus of the present invention.

Figure 6:
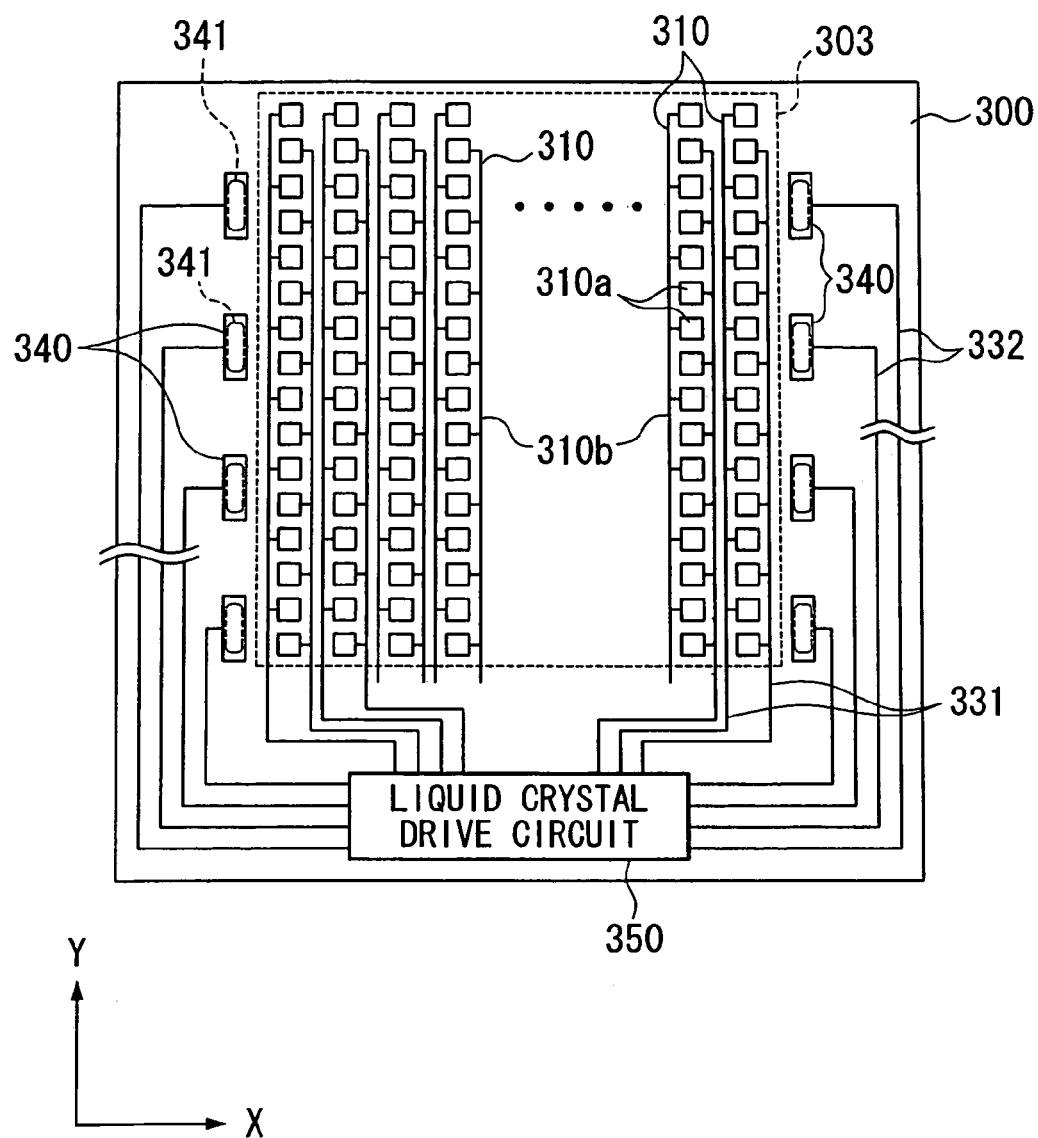
FIG. 6 a plan view showing an example in which an electro-optical apparatus of the present invention is applied to a liquid crystal display.

FIG. 6 is a plan view showing a layout of signal electrodes and the like disposed on a first substrate of a liquid crystal display of the present embodiment. The liquid crystal display of the present embodiment includes the first substrate, a second substrate (not shown) on which scanning electrodes and the like are provided, and liquid crystal (not shown) enclosed between the first and second substrate.

As shown in FIG. 6, in a pixel area 303 disposed on the first substrate 300, there are provided signal electrodes 310 that are arranged in a multiple matrix configuration. Each of the signal electrodes 310 includes pixel electrode sections 310a each of which corresponds to a pixel, and signal line sections 310b which connect the pixel electrode sections 310a to each other in a multiple matrix configuration. Each of the signal electrodes 310 extends in the y-direction.

Reference symbol 350 indicates a liquid crystal drive circuit having a single-chip structure. One end (bottom end as viewed in FIG. 6) of each of the signal line sections 310b is connected to the liquid crystal drive circuit 350 via a first lead line 331.

Reference symbol 340 indicates vertical transmission terminals. The vertical transmission terminals 340 are respectively connected to terminals provided on the second substrate (not shown) via vertical transmission elements 341. Each of the vertical transmission terminals 340 is connected to the liquid crystal drive circuit 350 via a second lead line 332.

In this embodiment, the signal line sections 310b, the first lead lines 331, and the second lead lines 332, which are provided on the first substrate 300, are fabricated using the method for fabricating wirings shown in FIGS. 1A and 1B. Accordingly, these lines and wirings may not easily have problems such as breakage or a short circuit, and it is easy to make the display device to be compact and thin. In addition, the method of the present invention makes it possible to effectively use materials for wirings and to reduce manufacturing costs even when the method of the present invention is applied to the case in which a large substrate is employed. The method of the present invention is applicable not only to the fabricating of devices such as the above-mentioned electro-optical apparatuses, but also to the fabricating of other devices such as a circuit board on which conductive film wirings are fabricated, wirings for packaging semiconductors, etc.

Next, specific examples of electronic apparatuses of the present invention will be explained.

Figure 7:
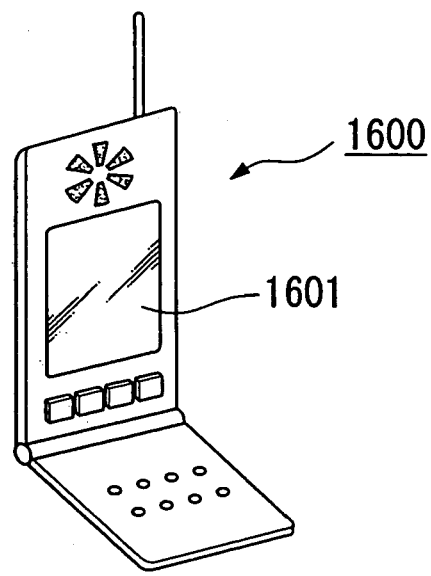
FIG. 7 is a diagram showing an example in which an electronic apparatus of the present invention is applied to a portable telephone having a liquid crystal display.

FIG. 7 is a perspective view of an example of a portable telephone. In FIG. 7, reference symbol 1600 indicates a body of the portable telephone, and reference symbol 1601 indicates a liquid crystal display portion having the liquid crystal device shown in FIG. 6.

Figure 8:
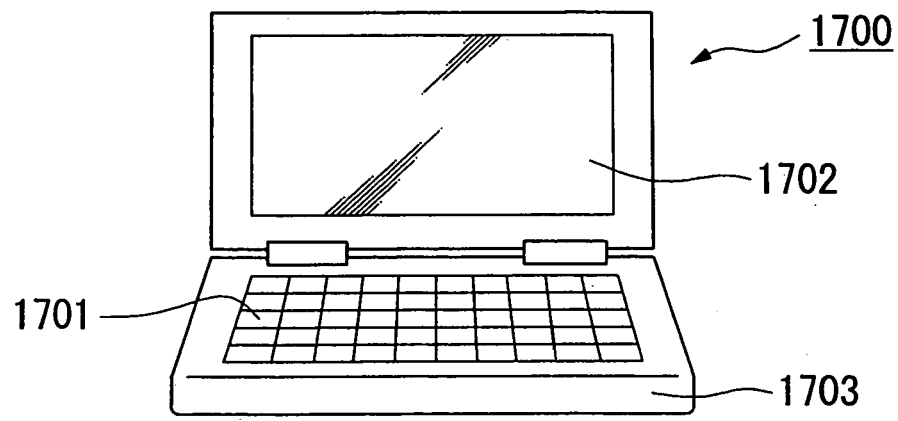
FIG. 8 is a diagram showing an example in which an electronic apparatus of the present invention is applied to a portable information processor having a liquid crystal display.

FIG. 8 is a perspective view of an example of a portable information processor such as a word processor, a personal computer, or the like. In FIG. 8, reference symbol 1700 indicates an information processor, reference symbol 1701 indicates an input device such as a keyboard, reference symbol 1703 indicates a body of the information processor, and reference symbol 1702 indicates a liquid crystal display portion having the liquid crystal device shown in FIG. 6.

Figure 9:
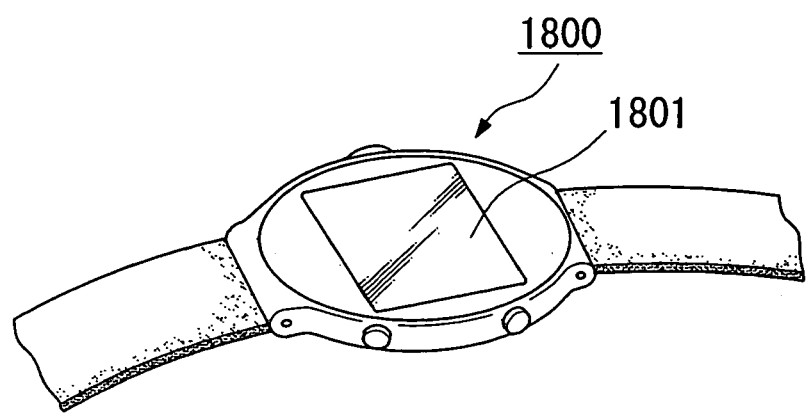
FIG. 9 is a diagram showing an example in which an electronic apparatus of the present invention is applied to a watch type electronic apparatus having a liquid crystal display.

FIG. 9 is a perspective view of an example of a watch type electronic apparatus. In FIG. 9, reference symbol 1800 indicates a body of the watch, and reference symbol 1801 indicates a liquid crystal display portion having the liquid crystal device shown in FIG. 6.

Because the electronic apparatuses shown in FIGS. 7 to 9 include the liquid crystal display according to the above embodiment, the electronic apparatuses may not easily have problems such as breakage or a short circuit, and it is easy to make the electronic apparatuses to be compact and thin.

The electronic apparatuses in this embodiment include liquid crystal displays; however, the electronic apparatuses may include other electro-optical devices such as an organic electroluminescent display device, a plasma display device, etc.

Next, other examples to which the fabrication method of the present invention is applied will be explained below.

Figure 10:
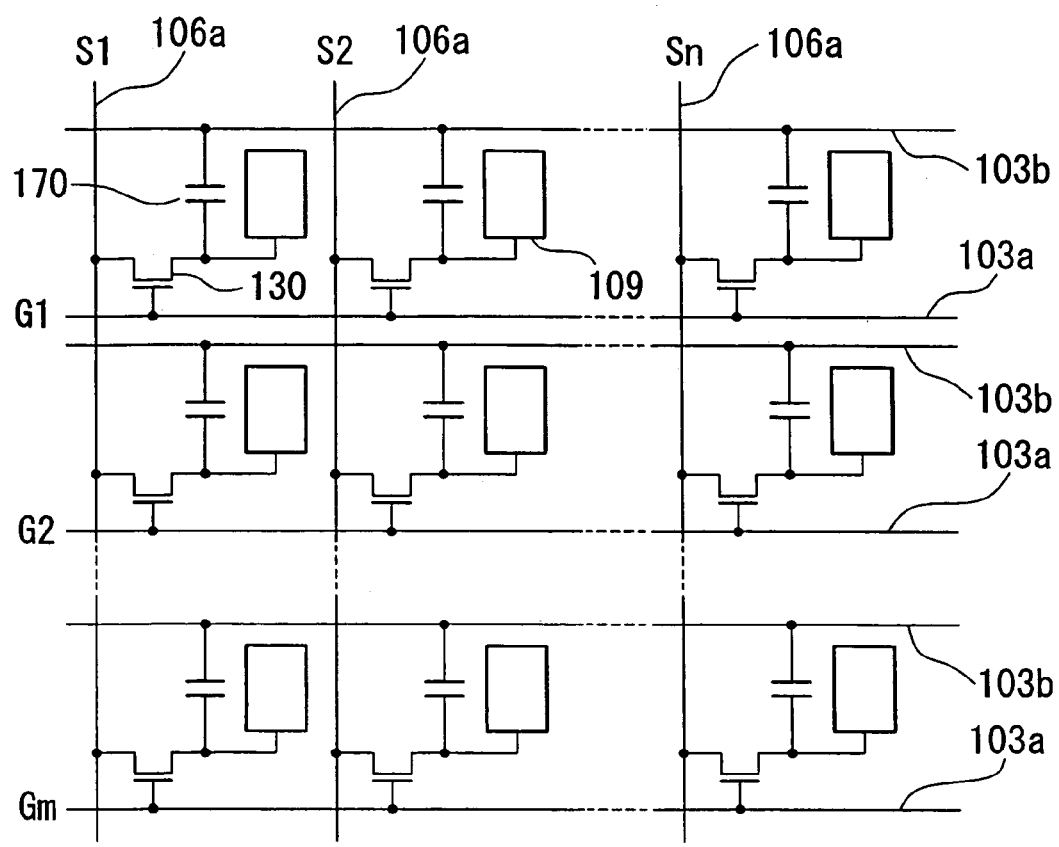
FIG. 10 is an equivalent circuit diagram showing switching elements and signal lines of a liquid crystal display to which a method for fabricating a device according to the present invention is applied.
Figure 11:
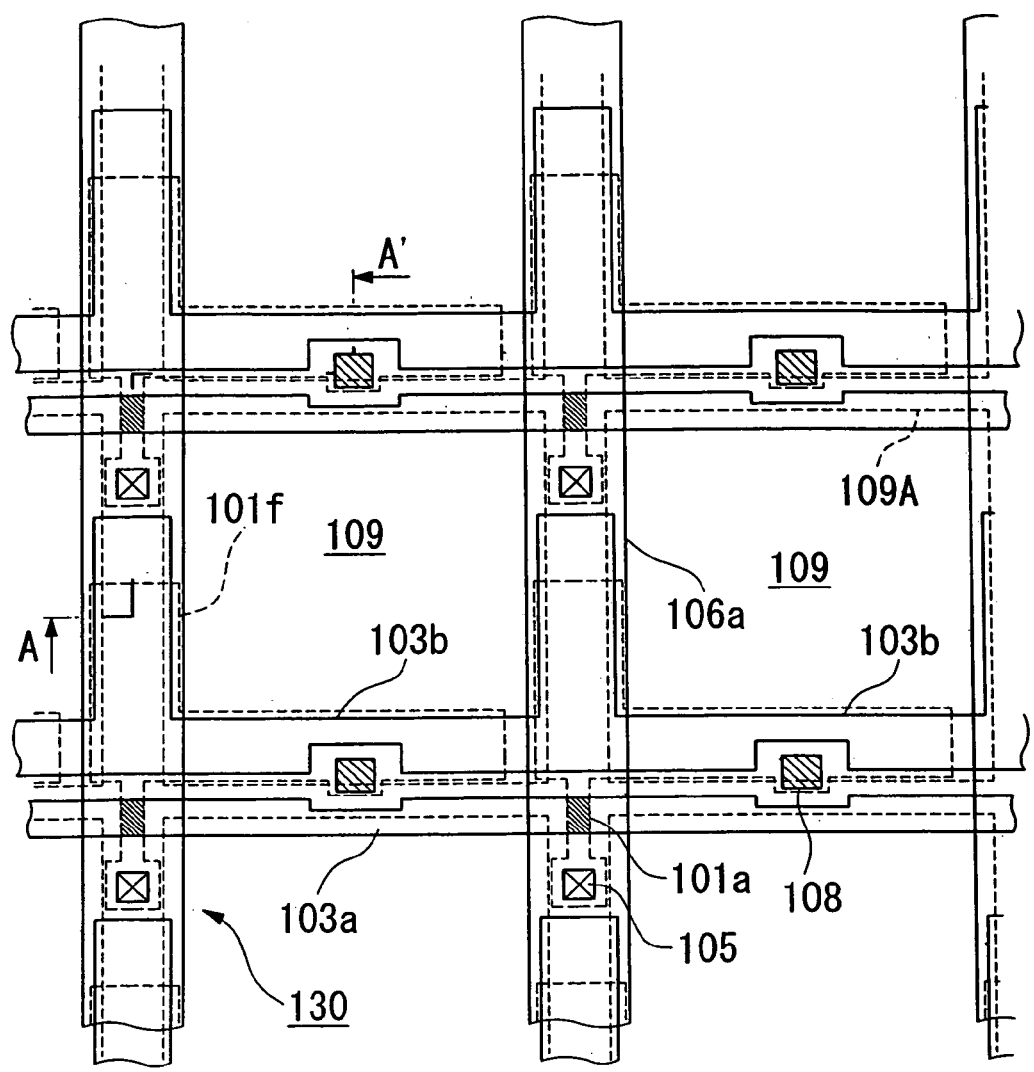
FIG. 11 is a plan view showing the structure of a TFT array board for a liquid crystal display to which a method for fabricating a device according to the present invention is applied.
Figure 12:
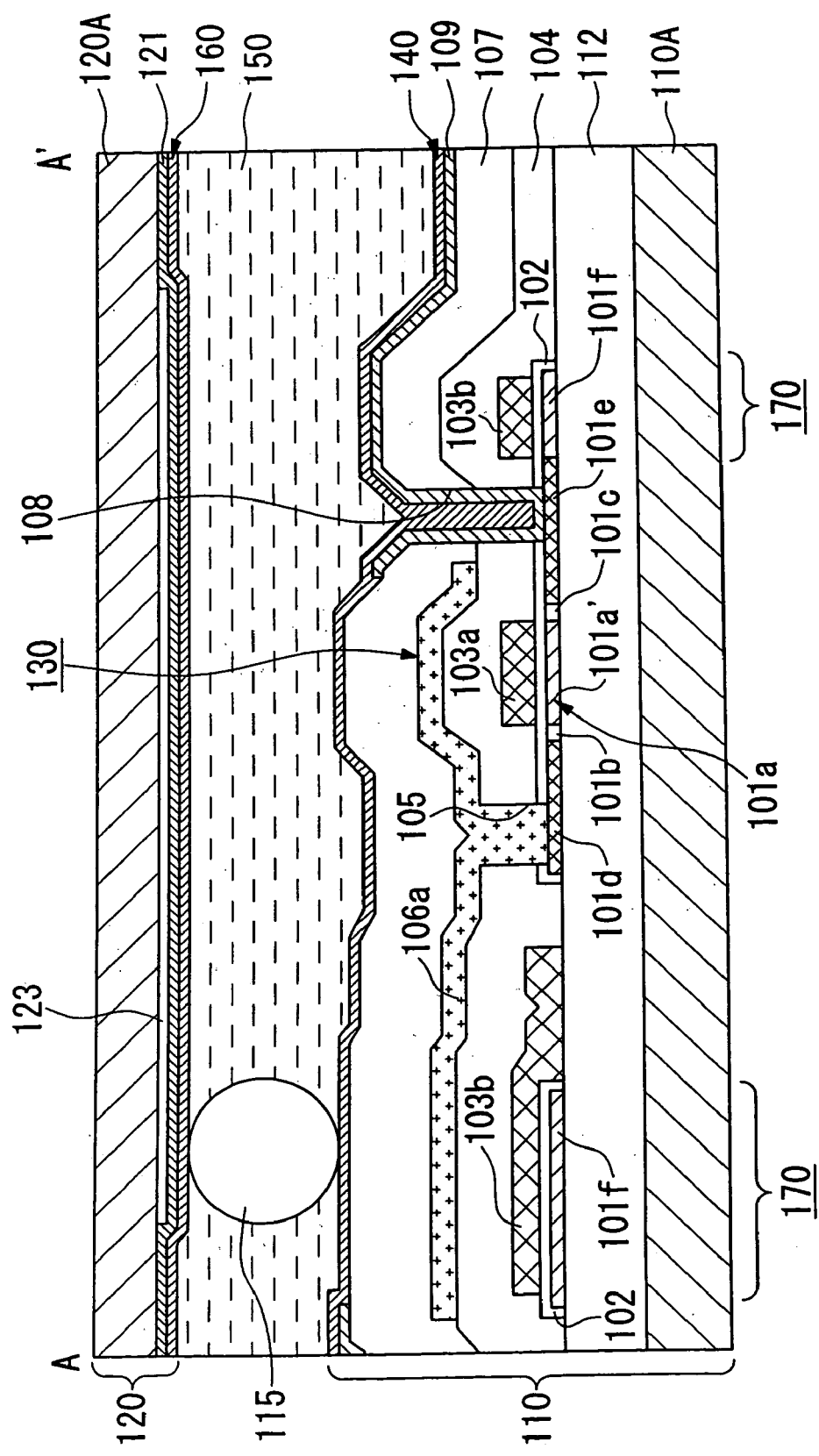
FIG. 12 is a cross-sectional view showing the main portion of a liquid crystal display to which a method for fabricating a device according to the present invention is applied.

The present invention is applicable to the case in which the liquid crystal display shown in FIGS. 10 to 12 is fabricated. The liquid crystal display of the present embodiment is a transmission liquid crystal display of an active matrix type in which TFTs (Thin Film Transistors) are employed as switching elements. FIG. 10 is an equivalent circuit diagram showing switching elements and signal lines of a plurality of pixels included in the transmission liquid crystal display, the pixels being arranged in a matrix configuration. FIG. 11 is a plan view showing the main structures of a plurality of pixels adjacent to each other included in a TFT array board on which data lines, scanning lines, pixel electrodes, and the like are fabricated. FIG. 12 is a cross-sectional view taken along the line A–A' in FIG. 11. In FIG. 12, the top of the drawing is the side to which light is input, and the bottom of the drawing is the viewing side (observer side). In FIGS. 10 to 12, different scales are applied to various layers and elements in order to show the various layers and elements in comprehensible sizes in the drawings.

In the liquid crystal display of the present embodiment, each of a plurality of pixels, which are arranged in a matrix configuration as shown in FIG. 10, is provided with a pixel electrode 109, and a TFT element 130 as a switching element that controls electrical current to be supplied to the pixel electrode 109. A data line 106a for transmitting image signals is electrically connected to a source of the TFT element 130. Image signals S1, S2, ..., Sn that are to be transmitted to the data lines 106a are sequentially input to the data lines 106a, or the image signals S1, S2, ..., Sn may be input for each group of data lines 106a that are arranged adjacent to each other. A scanning line 103a is connected to a gate of each of the TFT elements 130. Scanning signals G1, G2, . . . , Gn as pulses are sequentially input to the scanning lines 103a at a predetermined timing. The pixel electrode 109 is electrically connected to a drain of the TFT element 130. The pixel electrodes 109 input the image signals S1, S2, . . . , Sn, which are supplied from the data lines 103a, into liquid crystals at a predetermined timing by turning on the TFT elements 130 as switching elements for just a predetermined period. The image signals S1, S2, . . . , Sn that are input into the liquid crystals via the pixel electrodes 109 at predetermined levels are stored between the pixel electrodes 109 and common electrodes, which will be explained below, for a predetermined period. The orientation and order of the molecules of the liquid crystal change depending on the input voltage, and accordingly, the liquid crystal modulates light so that gradational display is achieved. A crystal capacitor is formed between the pixel electrode 109 and the common electrode, and a storage capacitor 170 is provided in parallel with the crystal capacitor in order to prevent leakage of the image signals.

Next, a planar main structure of the liquid crystal display of the present embodiment will be explained with reference to FIG. 11. As shown in FIG. 11, the pixel electrodes 109, each of which is made of a transparent and conductive material such as indium tin oxide (hereinafter abbreviated as "ITO") in a rectangular shape, are arranged in a matrix configuration on a TFT array substrate. The contour of each of the pixel electrodes 109 is indicated by broken lines. The data lines 106a, the scanning lines 103a, and capacitor lines 103b are formed along the vertical and horizontal boundaries of the pixel electrodes 109. Each pixel electrode 109 is electrically connected to one of the TFT elements that are provided corresponding to intersecting portions of the scanning lines 103a with the data lines 106a, whereby display by each of the pixels can be achieved. Each data line 106a is electrically connected, via a contact hole 105, to a source region, which will be explained below, included in a semiconductor layer 101a made of polysilicon membrane, for example. Each pixel electrode 109 is electrically connected to a drain region, which will be explained below, included in the semiconductor layer 101a via a contact hole 108. Each scanning line 103a is disposed so as to face channel regions (shown as diagonally hatched areas in FIG. 11), which will be explained below, included in the semiconductor layer 101a. Each scanning line 103a acts as gate electrodes at portions thereof which face the channel regions, respectively. Each capacitor line 103b includes a main line portion (i.e., a first region that is formed along one of the scanning lines 103a as viewed in the plan view) which extends substantially in a straight line along one of the scanning lines 103a, and projecting portions (i.e., second regions that are formed along the data lines 106a as viewed in the plan view) which extend along the data lines 106a from the intersections with the data lines 106a toward the front side (i.e., toward the top of the drawing).

Next, a cross-sectional structure of the liquid crystal display of the present embodiment will be explained with reference to FIG. 12. As mentioned above, FIG. 12 is a cross-sectional view taken along the line A–A' in FIG. 11, i.e., FIG. 12 is a cross-sectional view showing the structure of an area in which the TFT elements 130 are formed. In the liquid crystal display of the present embodiment, a liquid crystal layer 150 is sandwiched between a TFT array substrate 110 and an opposing substrate 120 that is opposite to the TFT array substrate. The TFT array substrate 110 includes, as main elements, a transparent substrate body 110A, the TFT element 130 that is formed on the surface of the substrate body 110A, which faces the liquid crystal layer 150, a pixel electrode 109, and an alignment layer 140. The opposing substrate 120 includes, as main elements, a transparent plastic substrate (substrate body) 120A, a common electrode 121 that is formed on the surface of the plastic substrate body 120A, which faces the liquid crystal layer 150, and an alignment layer 160. A predetermined substrate gap is ensured between the substrates 110 and 120 using a spacer 115. In the TFT array substrate 110, the pixel electrode 109 is provided on the surface of the substrate body 110A, which faces the liquid crystal layer 150. The TFT element 130, as a pixel switching element which performs switching control of the pixel electrode 109, is provided at a position adjacent to the pixel electrode 109. The pixel switching TFT element 130 has an LDD (Lightly Doped Drain) structure, and the pixel switching TFT element 130 includes the scanning line 103a, a channel region 101a' which is included in the semiconductor layer 101a, and in which a channel is formed by the effect of the electric field originating from the scanning line 103a, a gate insulation layer 102 which electrically insulates the scanning line 103a from the semiconductor layer 101a, the data line 106a, a low density source region 101b and a low density drain region 101c which are included in the semiconductor layer 101a, and a high density source region 101d and a high density drain region 101e which are included in the semiconductor layer 101a. Above the substrate body 110A, and on the scanning line 103a and gate insulation layer 102, there is provided a second interlayer insulation layer 104 in which the contact hole 105 that opens to the high density source region 101d and the contact hole 108 that opens to the high density drain region 101e are formed. In other words, the data line 106a is electrically connected to the high density source region 101d via the contact hole 105 that penetrates the second interlayer insulation layer 104. Moreover, on the data line 106a and on the second interlayer insulation layer 104, there is provided a third insulation layer 107 in which the contact hole 108 that opens to the high density drain region 101e is formed. In other words, the high density drain region 101e is electrically connected to the pixel electrode 109 via the contact hole 108 that penetrates the third insulation layer 107.

In this embodiment, the gate insulation layer 102 that extends from a position facing the scanning line 103a is used as a dielectric layer, a portion of the semiconductor layer 101a is used as a first storage capacitor electrode 101f, and a portion of the capacitor line 103b that is opposite to the gate insulation layer 102 and the first storage capacitor electrode 101f is used as a second storage capacitor electrode, and thus the storage capacitor 170 is formed. A first interlayer insulation layer 112 is formed between the substrate body 101A and the pixel switching TFT element 130, which is provided in order to electrically insulate the semiconductor layer 101a included in the pixel switching TFT element 130 from the substrate body 110A. Moreover, on the uppermost surface of the TFT array substrate 110, which faces the liquid crystal layer 150, i.e., on the pixel electrode 109 and on the third insulation layer 107, there is provided the alignment layer 140 which controls the orientation of the liquid crystal molecules contained in the liquid crystal layer 150 when a voltage is not applied. Accordingly, in the area in which the TFT element 130 is formed, irregularities and steps are formed on the uppermost surface of the TFT array substrate 110, which faces the liquid crystal layer 150, i.e., on the surface of the TFT array substrate 110, which supports the liquid crystal layer 150. On the other hand, to the opposing substrate 120, in particular, on the underside of the substrate body 120A, which faces the liquid crystal layer 150, and in the area corresponding to the area (non-pixel area) in which the data line 106a, the scanning line 103a, and the pixel switching TFT element 130 are formed, there is provided a second shading layer 123 for preventing incident rays from reaching the channel region 101a' included in the semiconductor layer 101a of the pixel switching TFT element 130, the low density source region 101b, and the low density drain region 101c. Furthermore, on the underside of the substrate body 120A, which faces the liquid crystal layer 150 while including the second shading layer 123, there is provided the common electrode 121 made of ITO or the like which substantially covers the entire underside of the substrate body 120A. In addition, on the underside of the common electrode 121, which faces the liquid crystal layer 150, there is provided the alignment layer 160 which controls the orientation of the liquid crystal molecules contained in the liquid crystal layer 150 when a voltage is not applied.

In this embodiment, the data line 106a, the scanning line 103a forming the gate electrode, the capacitor line 103b, the pixel electrode 109, and the like are fabricated using the fabrication method according to the present invention.

Figure 13:
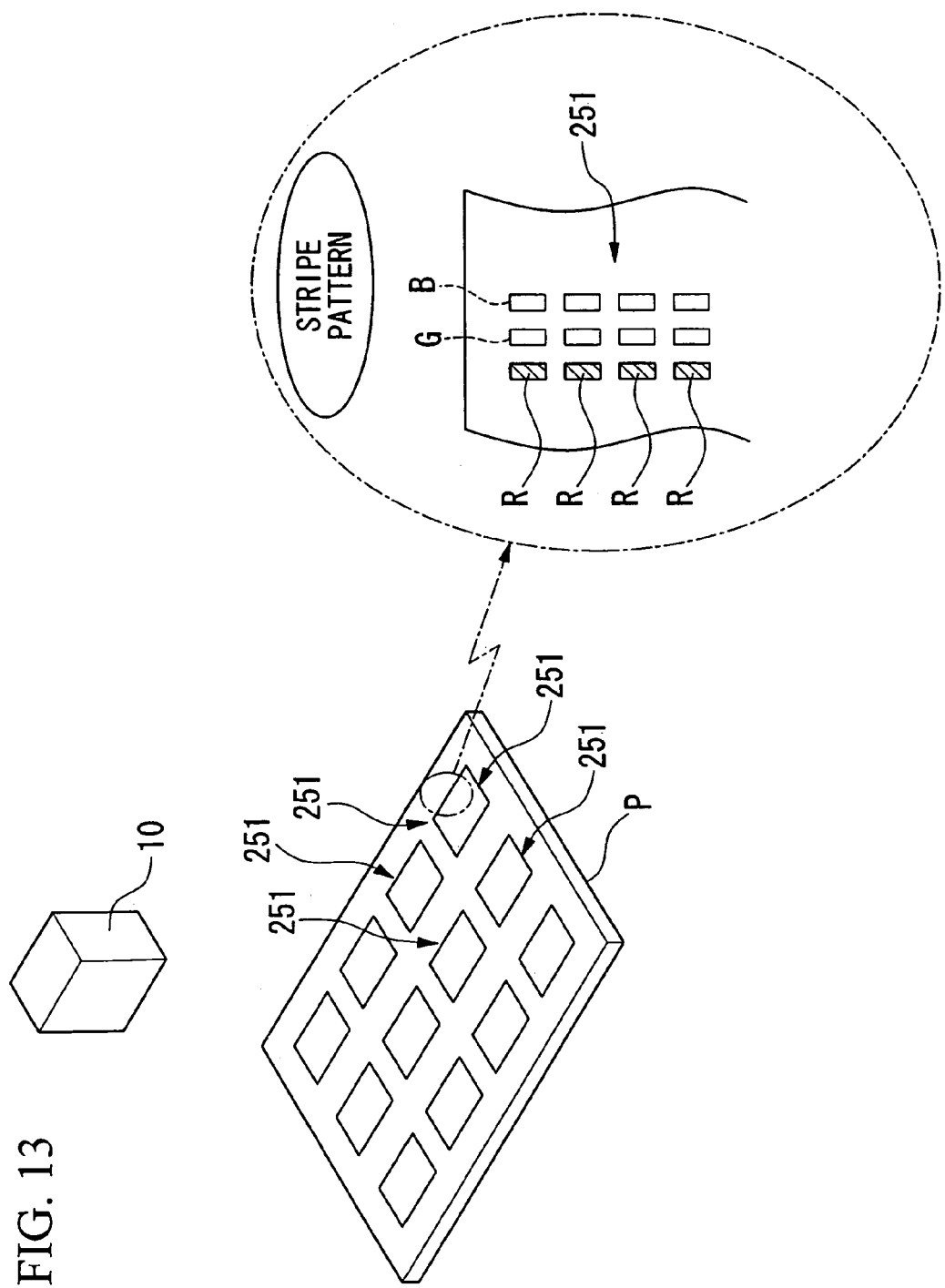
FIG. 13 is a schematic diagram showing a color filter to which a method for fabricating a device according to the present invention is applied.

The present invention may be used for fabricating a film that is included in a color filter. FIG. 13 shows a color filter formed on a substrate P. FIGS. 14A to 14F show manufacturing processes for the color filter. As shown in FIG. 13, in this example, a plurality of color filter regions 251 are formed in a matrix configuration on the substrate P having a rectangular shape in order to improve productivity. By cutting the substrate P in the subsequent process, the color filter regions 251 may be used as color filters that are applicable to a liquid crystal display. Each of the color filter regions 251 includes red liquid compositions R, green liquid compositions G, and blue liquid compositions B, each of which are arranged in a predetermined pattern, e.g., in a known stripe pattern in this example. The predetermined pattern may be a mosaic pattern, a delta pattern, a square pattern, etc., other than the stripe pattern. A surface-active agent is mixed in each of the liquid compositions R, G, and B.

For fabricating such color filter regions 251, as a first step, banks 252 are formed on one surface of the transparent substrate P as shown in FIG. 14A. The banks 252 are formed through the processes of spin coating, exposing, and developing. The banks 252 are arranged in a grid pattern as viewed in the plan view, and ink is disposed in each of the banks each of which is delimited by grids. The banks 252 may preferably have liquid-repellency. The banks 252 may preferably act as a black matrix. Next, as shown in FIG. 14B, liquid droplets 254 of the liquid compositions are ejected from the liquid ejecting head, and the liquid droplets 254 are disposed in filter recesses 253. The amount of the liquid droplets 254 is determined to be sufficient taking into account the volume reduction in the liquid compositions during a heating process. After all the filter recesses 253 on the substrate P are filled with the liquid droplets 254 through the above process, a heating process is carried out in which the substrate P is heated to a predetermined temperature (e.g., approximately 70° C.) using a heater. Through the heating process, the solvent contained in the liquid composition is vaporized, and the volume of the liquid composition is reduced. When the reduction in the volume is significant, the liquid droplet ejecting process and the heating process are repeated until a film thickness which is sufficient for the color filters is obtained. Through these processes, the solvent contained in the liquid composition is vaporized, and ultimately just the solid contents contained in the liquid composition remains so as to form films; thus color filters 255 of the films are obtained as shown in FIG. 14C. Consequently, as shown in FIG. 14D, a protection layer 256 is formed above the substrate so as to cover the color filters 255 and the banks 252 in order to flatten the substrate P and to protect the color filters 255. The protection layer 256 may be formed using a spin coating process, a roll coating process, a lip coating process, or the like; however, the liquid ejecting process may be used as in the case of forming the color filters 255. Next, as shown in FIG. 14E, a transparent conductive film 257 is formed on the entire surface of the protection layer 256 using a sputtering process, a vacuum deposition process, or the like. After that, a patterning process is applied to the transparent conductive film 257 so as to form pixel electrodes 258 having patterns corresponding to the filter recesses 253 as shown in FIG. 14F. Note that if TFTs (Thin Film Transistors) are used for driving the liquid display panel, the patterning process is not necessary.

In this embodiment, the fabrication method according to the present invention may be used for fabricating the color filters 255 and the pixel electrodes 258. For fabricating the color filters, liquid droplets are disposed in the banks so as to form a plurality of line-shaped patterns, and then another set of liquid droplets are disposed between the line-shaped patterns so as to integrate the line-shaped patterns with each other.

The present invention may be used for fabricating an organic EL device. A method for fabricating an organic EL device will be explained with reference to FIGS. 15A to 15E and 17A to 17C. In FIGS. 15A to 15E and 17A to 17C, only a single pixel is illustrated for simplification.

Figure 15A:
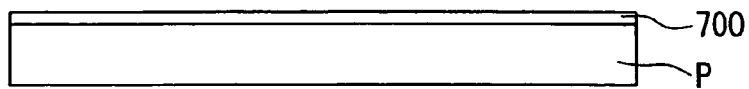
FIGS. 15A to 15E are schematic diagrams showing the fabrication processes for an organic EL device to which a method for fabricating a device according to the present invention is applied.
Figure 15B:
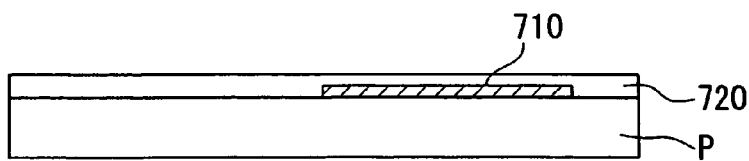
Figure 15C:
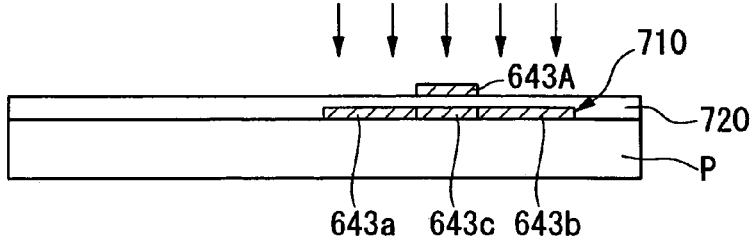
Figure 15D:
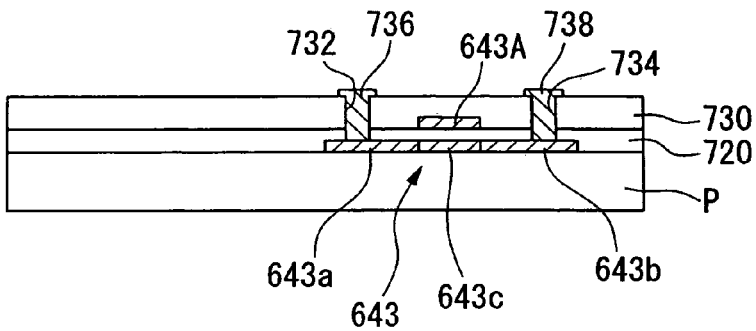
Figure 15E:
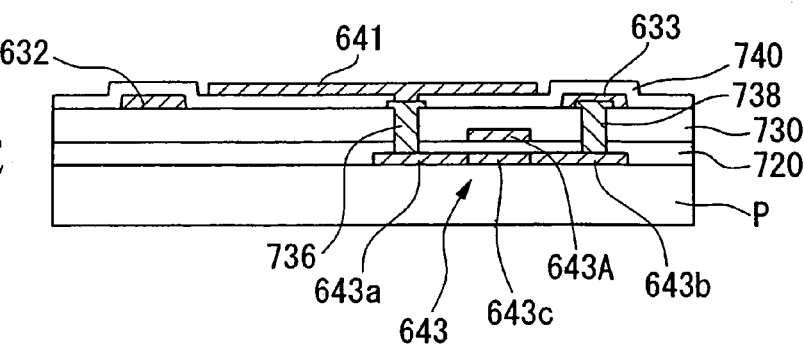

First, a substrate P is prepared. In the case of an organic EL element, luminescent light produced by a luminescent layer may be seen from the substrate side, and may also be seen from the opposite side of the substrate. In order to see the luminescent light from the substrate side, the material of the substrate must be a transparent material or a translucent material such as glass, silica, plastic, or the like, and among these materials, glass may be preferably employed because it is inexpensive. In this example, as shown in FIG. 15A, the transparent substrate P of glass or the like is used as a substrate. On the substrate P, a semiconductor film 700 of an amorphous silicon film is formed. Next, a crystallization process such as a laser annealing process, a solid phase growth process, or the like, is applied to the semiconductor film 700, and the semiconductor film 700 is crystallized as a polysilicon film. Next, as shown in FIG. 15B, by applying a patterning process to the semiconductor film (polysilicon film) 700, discrete semiconductor films 710 are obtained, and a gate insulation layer 720 is formed on the surface of the discrete semiconductor films 710. Next, as shown in FIG. 15C, a gate electrode 643A is formed. In this state, phosphorus ions in a high density condition are radiated, and source and drain regions 643a and 643b are formed in areas in the semiconductor film 710 which are not covered by the gate electrode 643A. An area in the semiconductor film 710 to which the impurities are not doped becomes a channel region 643c. Next, as shown in FIG. 15D, an interlayer insulation layer 730 having contact holes 732 and 734 therein is formed, and then the contact holes 732 and 734 are filled with hookup electrodes 736 and 738, respectively. Next, as shown in FIG. 15E, a signal line 632, a common feeder line 633, and a scanning line (not shown in FIGS. 15A to 15E) are formed on the interlayer insulation layer 730.

The hookup electrode 738 and other lines may be formed in one process. In this case, the hookup electrode 736 is formed by an ITO layer which will be explained below. An interlayer insulation layer 740 is formed so as to cover the upper surface of the lines. A contact hole (not shown) is formed at a position corresponding to the hookup electrode 736, and the ITO layer is formed in the contact hole (not shown) as well. By applying a patterning process to the ITO layer, a pixel electrode 641, which is electrically connected to the source and drain regions 643*a*, is formed in a predetermined area surrounded by the signal line 632, the common feeder line 633, and the scanning line (not shown). As will be explained below, a hole-injection layer and a luminescent layer are to be formed in the area surrounded by the signal line 632, the common feeder line 633, and the scanning line (not shown).

Figure 16A:
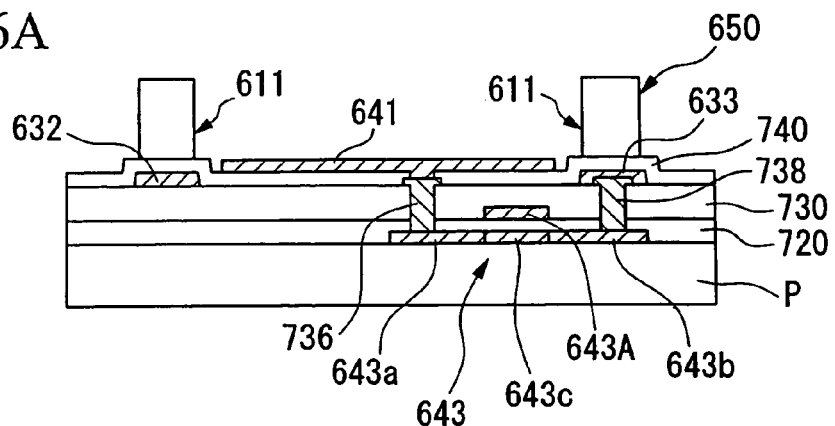
FIGS. 16A to 16C are schematic diagrams showing the fabrication processes for the organic EL device to which a method for fabricating a device according to the present invention is applied.
Figure 16B:
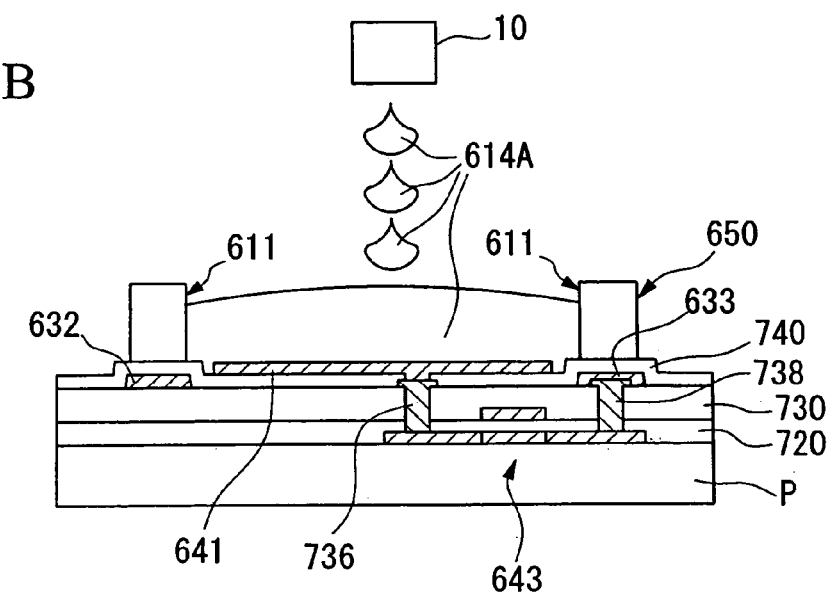
Figure 16C:
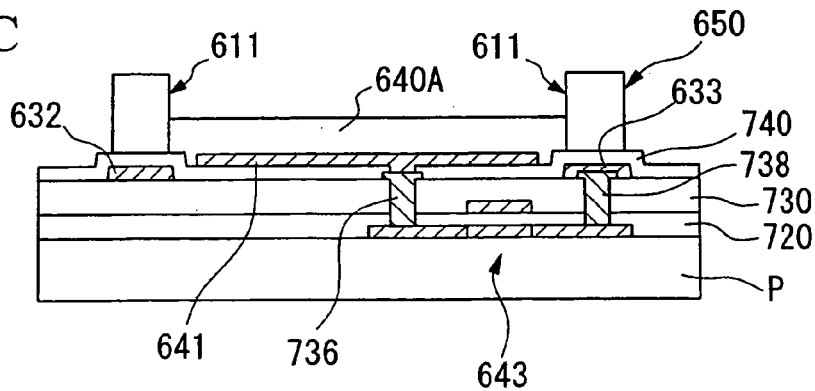

Next, as shown in FIG. 16A, banks 650 are formed so as to surround the area in which the hole-injection layer and the luminescent layer are to be formed. The banks 650, which act as partitions, may be preferably an organic insulation material such as polyimide or the like. The banks 650 preferably have a non-affinity with respect to the liquid composition that is ejected from the liquid ejecting head. In order to provide the non-affinity to the banks 650, for example, a surface treatment is applied to the surfaces of the banks 650 in which a fluorine compound or the like is used. The fluorine compound may be, for example, $CF_4$, $SF_5$, $CHF_3$, etc. As the surface treatment, a plasma treatment, UV radiation treatment, or the like may be employed. Accordingly, a step 611 having a sufficient height is formed between the area in which the hole-injection layer and the luminescent layer are to be formed, i.e., the area on which materials for forming the hole-injection layer and the luminescent layer are to be deposited and the banks 650 that surround the area. Next, as shown in FIG. 16B, under the condition in which the upper surface of the substrate P is directed upward, the liquid composition 614A containing the material for forming the hole-injection layer is selectively ejected from the liquid ejecting head onto the deposition area surrounded by the banks 650, i.e., inside the banks 650. Next, as shown in FIG. 16C, the solvent contained in the liquid composition 614A is vaporized through a heating process or an optical radiation process, and a solid hole-injection layer 640A is formed on the pixel electrode 641.

Figure 17A:
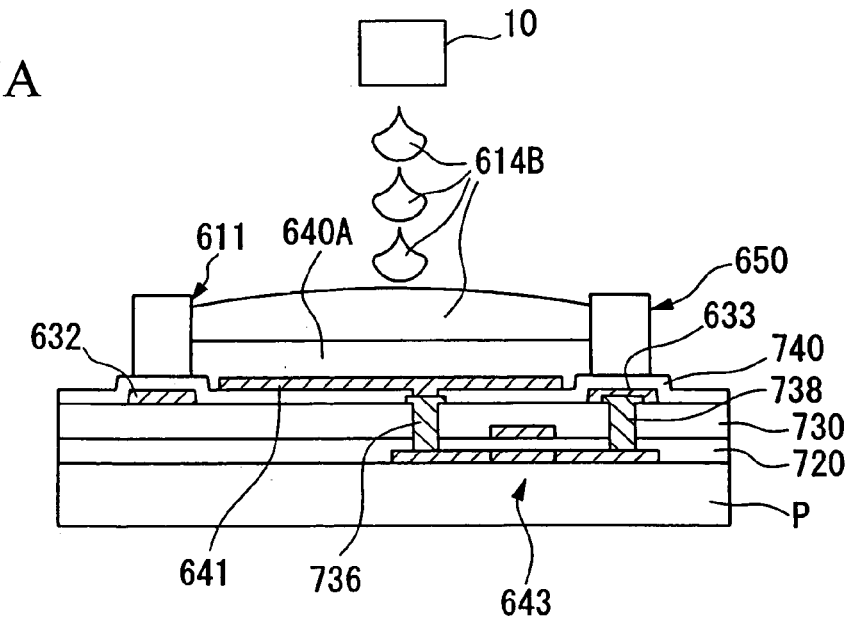
FIGS. 17A to 17C are schematic diagrams showing the fabrication processes for the organic EL device to which a method for fabricating a device according to the present invention is applied.
Figure 17B:
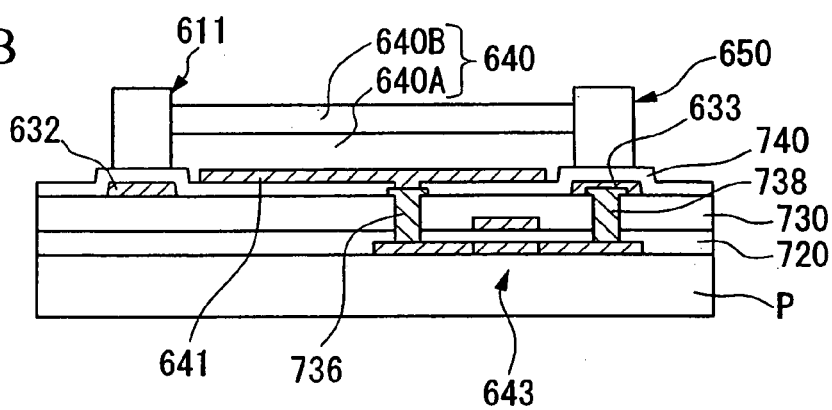
Figure 17C:
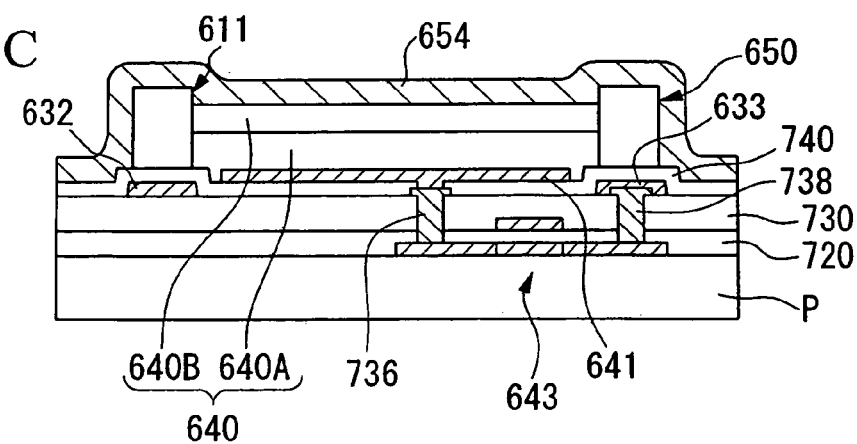

Next, as shown in FIG. 17A, under the condition in which the upper surface of the substrate P is directed upward, the liquid composition 614B containing the material for forming the luminescent layer (a luminescent material) is selectively ejected from the liquid ejecting head onto the hole-injection layer 640A inside the banks 650. When the liquid composition 614B containing the material for forming the luminescent layer is ejected from the liquid ejecting head, the liquid composition 614B is deposited onto the hole-injection layer 640A in the banks 650. In this case, the forming of the luminescent layers by the ejection of the liquid composition 614B is performed in such a manner that the liquid composition containing the material for forming the luminescent layer that emits red luminescent light is ejected and deposited onto the pixels for red, the liquid composition containing the material for forming the luminescent layer that emits green luminescent light is ejected and deposited onto the pixels for green, and the liquid composition containing the material for forming the luminescent layer that emits blue luminescent light is ejected and deposited onto the pixels for blue. The pixels corresponding to each of the colors are arranged in an orderly pattern in advance. When the ejection and deposition of the liquid compositions 614B containing the material for forming the luminescent layers are completed, the solvents contained in the liquid compositions 614B are vaporized, whereby a solid luminescent layer 640B is formed on each of the hole-injection layers 640A as shown in FIG. 17B, i.e., a luminescent portion 640 consisting of the hole-injection layers 640A and the luminescent layer 640B is obtained. After that, as shown in FIG. 17C, a reflection electrode 654 covering the entirety of the transparent substrate P is formed, or reflection electrodes 654 arranged in a stripe configuration are formed, and thus the organic EL element is fabricated.

As explained above, in this embodiment, the hole-injection layers 640A and the luminescent layer 640B are fabricated using the liquid ejecting process, i.e., are fabricated using the method according to the present invention. The signal line 632, the common feeder line 633, the scanning line, the pixel electrode 641, and the like are also fabricated using the method according to the present invention.

The preferred embodiments of the present invention are explained above with reference to the appended drawings; however, the present invention is not limited to these embodiments. The configurations and combinations of the various elements shown in the above embodiments are merely examples, and various modifications may be made based on designing requirements and the like without departing from the scope of the present invention. Advantageous Effects Obtainable by the Invention According to the method and apparatus for fabricating a pattern, a plurality of line-shaped patterns (first patterns) are formed on a substrate, and a plurality of liquid droplets are disposed between the line-shaped patterns so that the line-shaped patterns are integrated, whereby a wide film pattern having edges of a preferable shape may be fabricated on the substrate.

The conductive film wiring of the present invention may be made wide so as to be preferable in terms of electrical conductivity.

According to the method of the present invention for fabricating a device, a wide and conductive film wiring which is preferable in terms of electrical conductivity may be obtained.

According to the electro-optical apparatus of the present invention, breakage and short circuits may not easily occur, and thus an improved quality of products may be obtained.

What is claimed is:

1. A method for fabricating a pattern, in which a liquid material is ejected as liquid droplets from a liquid droplet ejecting section, the method comprising:
   forming a plurality of first patterns on a substrate by disposing the liquid droplets so that a pitch between the liquid droplets is greater than a diameter of each of the liquid droplets as measured immediately after disposition on the substrate, the forming of the plurality of first patterns comprising:
      disposing first liquid droplets at a first pitch in a longitudinal direction of the first patterns; and
      disposing second liquid droplets between the first droplets at a second pitch in the longitudinal direction of the first patterns; and
   integrating the plurality of first patterns with each other by disposing the liquid droplets between the plurality of first patterns.

2. A method for fabricating a pattern according to claim 1, the liquid droplets being disposed so that the pitch between the liquid droplets is less than two times the diameter of each of the liquid droplets as measured immediately after disposition on the substrate.

3. A method for fabricating a pattern according to claim 1, the first pitch between two adjacent liquid droplets in the longitudinal direction of the first patterns being greater than a diameter of each of the first liquid droplets as measured immediately after disposition on the substrate, and the second pitch between two adjacent second liquid droplets in the longitudinal direction of the first patterns being greater than a diameter of each of the second liquid droplets as measured immediately after disposition on the substrate.

4. A method for fabricating a device that includes a substrate and a conductive film wiring formed on the substrate, the method comprising:

forming a pattern on the substrate by ejecting a liquid material as liquid droplets from a liquid droplet ejecting section, the forming of the pattern comprising:

forming a plurality of first patterns that are substantially parallel to each other by disposing the liquid droplets on the substrate so that a pitch between the liquid droplets is greater than a diameter of each of the liquid droplets as measured immediately after disposition on the substrate; the forming of the plurality of first patterns comprising:

disposing first liquid droplets at a first pitch in a longitudinal direction of the first patterns; and disposing second liquid droplets between the first droplets at a second pitch in the longitudinal direction of the first patterns; and integrating the plurality of first patterns with each other by disposing the liquid droplets between the plurality of first patterns.

5. A method for fabricating a device according to claim 4, the forming of the pattern comprises forming a plurality of first patterns that are substantially parallel to each other by disposing the liquid droplets on the substrate so that the pitch between the liquid droplets is less than two times the diameter of each of the liquid droplets as measured immediately after disposition on the substrate.

6. A method for fabricating a pattern according to claim 4, the first pitch between two adjacent liquid droplets in the longitudinal direction of the first patterns being greater than a diameter of each of the first liquid droplets as measured immediately after disposition on the substrate, and the second pitch between two adjacent second liquid droplets in the longitudinal direction of the first patterns being greater than a diameter of each of the second liquid droplets as measured immediately after disposition on the substrate.

* * * * *